US009039280B2

(12) United States Patent
Peroulis et al.

(10) Patent No.: US 9,039,280 B2
(45) Date of Patent: May 26, 2015

(54) HIGHLY-RELIABLE MICRO-ELECTROMECHANICAL SYSTEM TEMPERATURE SENSOR

(71) Applicant: Purdue Research Foundation, West Lafayette, IN (US)

(72) Inventors: Dimitrios Peroulis, West Lafayette, IN (US); Andrew S Kovacs, Lafayette, IN (US); David Joseph Koester, Lafayette, IN (US); Farshid Sadeghi, West Lafayette, IN (US); Sean M Scott, Albuerque, NM (US); Douglas Edward Adams, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 296 days.

(21) Appl. No.: 13/747,433

(22) Filed: Jan. 22, 2013

(65) Prior Publication Data
US 2013/0202012 A1    Aug. 8, 2013

Related U.S. Application Data

(60) Provisional application No. 61/589,120, filed on Jan. 20, 2012.

(51) Int. Cl.
*G01K 7/00* (2006.01)
*G01K 7/34* (2006.01)
*G01K 1/02* (2006.01)
*G01K 13/08* (2006.01)

(52) U.S. Cl.
CPC *G01K 7/34* (2013.01); *G01K 1/024* (2013.01); *G01K 13/08* (2013.01)

(58) Field of Classification Search
USPC .......................................................... 374/184
See application file for complete search history.

(56) References Cited

U.S. PATENT DOCUMENTS

| 5,914,801 A * | 6/1999 | Dhuler et al. ................. 359/230 |
| 6,229,684 B1 * | 5/2001 | Cowen et al. ................. 361/278 |
| 6,450,654 B1 * | 9/2002 | Koester ........................ 359/872 |
| 7,780,357 B2 | 8/2010 | Varonis |
| 2014/0204976 A1 * | 7/2014 | Peroulis et al. ............... 374/184 |

OTHER PUBLICATIONS

Nickel, et al. "In situ tribocomponent temperature measurement using a radio telemetry," Tribology Trans., 1997, vol. 40, No. 3; pp. 514-520.

Scholl, et al., "Wireless passive SAW sensor systems for industrial and domestic applications," Proceedings of the 1998 IEEE International Frequency Control Symposium, 1998, pp. 595-601.

(Continued)

*Primary Examiner* — Lisa Caputo
*Assistant Examiner* — Jamel Williams
(74) *Attorney, Agent, or Firm* — Wilmer Cutler Pickering Hale and Dorr LLP

(57) ABSTRACT

A micro-electromechanical system-type (MEMS) sensor arrangement for wirelessly measuring temperatures is disclosed. The MEMS sensor arrangement includes a multimorph sensor, a sensor coil coupled to the multimorph sensor, and a readout coil configured to be magnetically coupled to the sensor coil to i) energize the sensor coil, and ii) provide a readout of the natural frequency of the multimorph sensor, the sensor coil and the readout coil.

25 Claims, 39 Drawing Sheets

(56) References Cited

OTHER PUBLICATIONS

Binder, et al. "Packaging and antenna design for wireless SAW temperature sensors in metallic environments," 2009 IEEE Sensors, 2009, pp. 807-810.

Kocer, et al. "An RF powered, wireless temperature sensor in quarter micron CMOS," Proceedings of the 2004 International Symposium on Circuits and Systems, 2004, vol. 4, pp. 876-879.

Pertijs, et al. "A CMOS Smart Temperature Sensor With a 3σ Inaccuracy of ±0.1° C. From -55° C. to 125° C.," IEEE Journal of Solid-State Circuits, 2005, vol. 40, No. 12; pp. 2805-2815.

Huque, et al. "Towards fully integrated high temperature wireless sensors using GaN-based HEMT devices," 51st Midwest Symposium on Circuits and Systems, 2008, pp. 582-585.

Casady, et al "A Hybrid 6H-SiC Temperature Sensor Operational from 25° C. to 500° C.," IEEE Transactions on Components, Packaging, and Manufacturing Technology—Part A, 1996, vol. 19, No. 3; pp. 416-422.

Muzykov, et al. "Physical phenomena affecting performance and reliability of 4H-SiC bipolar junction transistors," Microelectronics Reliability, 2009, vol. 49, No. 1; pp. 32-37.

Zhang, et al. "Modified (K0.5Na0.5)NbO3 based lead-free piezoelectrics with broad temperature usage range," Applied Physics Letters, 2007, vol. 91, No. 13; pp. 132913-1-132913-3.

Sabat, et al. "Temperature dependence of the complete material coefficients matrix of soft and hard doped piezoelectric lead zirconate titanate ceramics," Journal of Applied Physics, 2007, vol. 101, No. 6; pp. 064111-1-064111-7.

Kovacs, et al. "Early-Warning Wireless Telemeter for Harsh-Environment Bearings," 2007 IEEE Sensors, 2007, pp. 946-949.

Dehennis, et al. "A Wireless Microsystem for the Remote Sensing of Pressure, Temperature, and Relative Humidity," Journal of Microelectromechanical Systems, 2005, vol. 14, No. 1; pp. 12-22.

Marioli, et al. "Passive Hybrid MEMS for High-Temperature Telemetric Measurements," IEEE Transactions on Instrumentation and Measurement, 2010, vol. 59, No. 5; pp. 1353-1361.

Hsu, et al. "A viscoelastic-aware experimentally-derived model for analog RF MEMS varactors," 2010 IEEE 23rd International Conference on Micro Electro Mechanical Systems (MEMS), 2010, pp. 783-786.

Scott, et al. "Wireless temperature microsensors integrated on bearings for health monitoring applications," 2011 IEEE 24th International Conference on Micro Electro Mechanical Systems (MEMS), 2011, pp. 660-663.

Weihs, et al. "Mechanical deflection of cantilever microbeams: A new technique for testing the mechanical properties of thin films," Journal of Materials Research, 1988, vol. 3, No. 5; pp. 931-942.

Hodge, et al. "Stresses in Thin Film Metallization," IEEE Transactions on Components, Packaging, and Manufacturing Technology—Part A, 1997, vol. 20, No. 2; pp. 241-250.

Fang, et al. "Determining thermal expansion coefficients of thin films using micromachined cantilevers," Sensors and Actuators, 1999, vol. 77, No. 1; pp. 21-27.

Ashtekar, A. et al., "Bearing Cage Telemeter for the Detection of Shaft Imbalance in Rotating Systems," IEEE, Purdue University, West Lafayette, Indiana, USA 47907, Radio and Wireless Symposium, Jan. 10-14, 2010, 4 pages.

Gudorf, S. et al., "Sensitivity of RF Sensors for Bearing Health Monitoring," Tribology Transactions, vol. 52, pp. 655-662, 2009 (Retrieved from the internet on Jun. 26, 2012), 8 pages.

Henao-Sepulveda, J.A. et al., "Contactless Monitoring of Ball Bearing Temperature," IMTC 2005—Instrumentation and Measurement Technology Conference, Ottawa, Canada, 3 pages (May 17-19, 2005).

Henao-Sepúlveda, Jhon A., "Development of RF-Powered Wireless Temperature Sensor for Bearing Health Monitoring," Thesis from University of Puerto Rico, Mayaguez Campus. UMI No. 1421822, 88 pages (May 17, 2004).

Jia, Y. et al., "Wireless Temperature Sensor for Bearing Health Monitoring," Smart Structures and Materials 2004: Sensors and Smart Structures Technologies for Civil, Mechanical, and Aerospace Systems, Proc. of SPIE, vol. 5391, pp. 368-376, 9 pages (Retrieved from the internet on Jul. 21, 2014) <http://proceedings.spiedigitallibrary.org>.

Ma, H.Y. et al., "A Micromachined Silicon Capacitive Temperature Sensor for Radiosonde Applications," IEEE Sensors 2009 Conference, Oct. 25-28, 2009, pp. 1693-1696, 4 pages.

Ma, H.Y. et al., "Modeling and simulation of a novel capacitive temperature sensor,", Key Laboratory of MEMS of Ministry of Education, Southeast University, Nanjing, China 210096, 9th Annual Conference on Solid-State and Integrated-Circuit Technology, Oct. 20-23, 2008, 4 pages.

Nickel, D.A. et al., "In Situ Tribocomponent Temperature Measurement Using a Radio Telemeter," Tribology Transactions, vol. 40, No. 3, pp. 514-520, 1997, accessed Jul. 31, 2014, (8 pages).

Xactix, Inc. "Xactix Xetch Xenon Difluoride Etching Systems," http://www.xactix.com.

Olympus, "Olympus LEXT OLS-3100 Confocal Laser Scanning Microscope," http://www.olympus-global.com/en/news/2007a/nr070125lext31e.jsp.

Analog Devices, Inc. "Analog Devices AD7746: 24-bit, 2 Channel Capacitance to Digital Converter," http://www.analog.com/en/analog-to-digital-converters/capacitance-to-digital-converters/ad7746/products/product.html.

Scott, et al. "Experimental quantification of temperature uncertainty for an array of thermally-sensitive MEMS cantilever beams," IEEE Antennas and Propagation Society International Symposium, 2009, pp. 1-4.

Keithley Instruments, Inc. "Keithley 6221 and 6220 Source Data Sheet," Keithley Instruments, Inc., Cleveland.

Pamidighantam, et al. "Pull-in voltage analysis of electrostatically actuated beam structures with fixed-fixed and fixed-free end conditions," Journal of Micromechanics and Microengineering, 2002, vol. 12, No. 4; pp. 458-464.

Scott, et al. "An inherently-robust 300° C. MEMS temperature sensor for wireless health monitoring of ball and rolling element bearings," 2009 IEEE Sensors, 2009, pp. 975-978.

Sargent Irrigation, "Deep Well Turbine Pumps: Operating Instructions," http://www.sargentirrigation.com/instr.htm.

Experimental Aircraft Info, "Servicing Aircraft Wheel Bearings," http://www.experimentalaircratinfo/articles/aircraft-wheel-bearings.php.

Timken, Inc. "Industrial Bearing Maintenance Manual," The Timken Company, 2008.

Gruber, "Maximizing Bearing Service Life," Industrial Lubrication, 2008, pp. 6-8.

Cao, et al. "Mechanism of temperature-induced plastic deformation of amorphous dielectric films for MEMS applications," 18th IEEE International Conference on Micro Electro Mechanical Systems, 2005, pp. 471-474.

Robert, et al. "Integrated RF-MEMS switch based on a combination of thermal and electrostatic actuation," 12th International Conference on Transducers, Solid-State Sensors, Actuators and Microsystems, 2003, vol. 2, pp. 1714-1717.

Liu, et al. "A thermomechanical relay with microspring contact array," The 14th IEEE International Conference on Micro Electro Mechanical Systems, 2001, pp. 220-223.

Chen, et al. "Stress relaxation during thermal cycling in metal/polyimide layered films," Journal of Applied Physics, 1988, vol. 64, No. 12; pp. 6690-6698.

Pal, et al. "Repeatability study of an electrothermally actuated micromirror," 2009 IEEE International Reliability Physics Symposium, 2009, pp. 549-556.

* cited by examiner

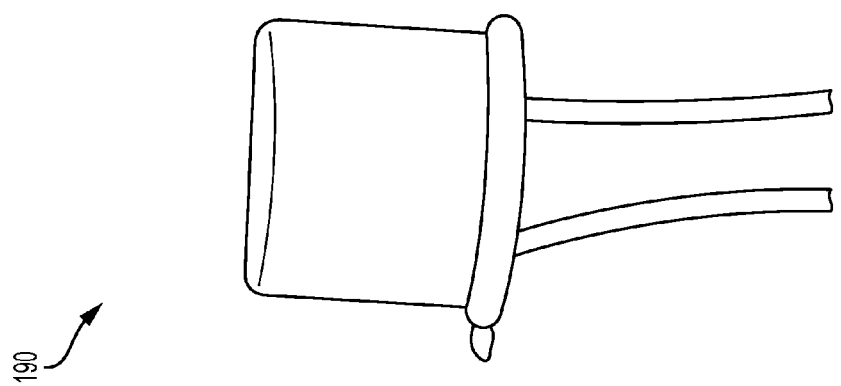
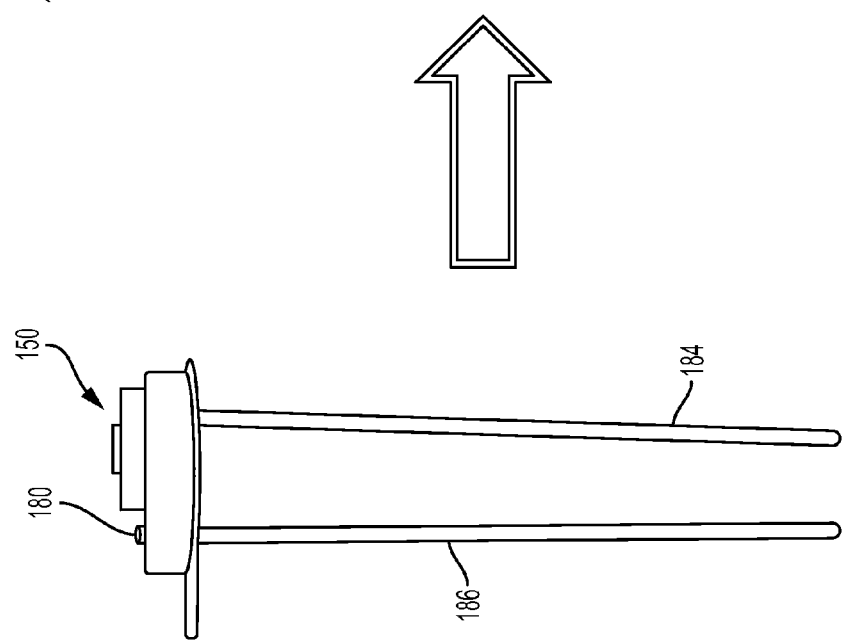
FIG. 7(a)
FIG. 7(b)

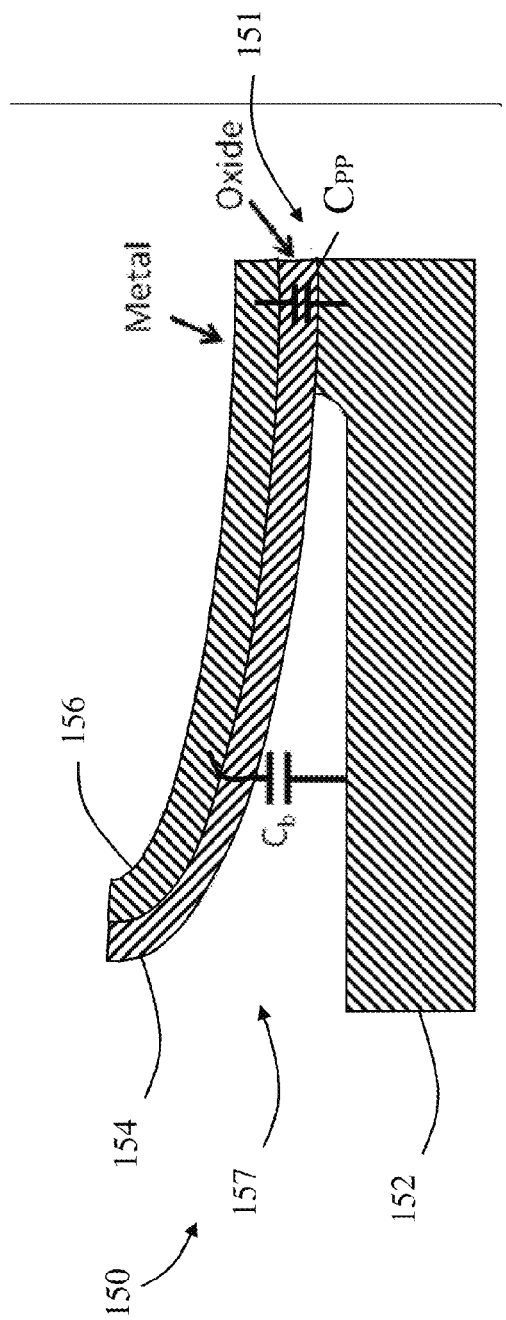
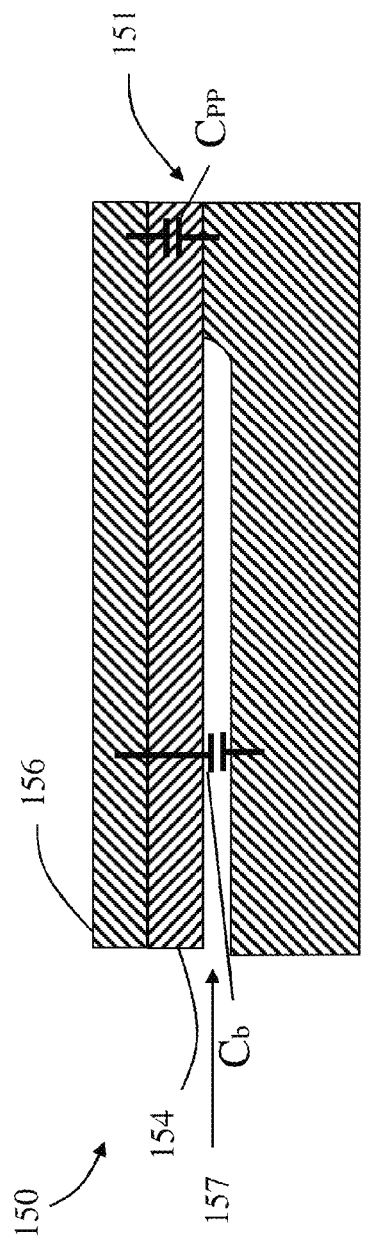
FIG. 8(a)
FIG. 8(b)

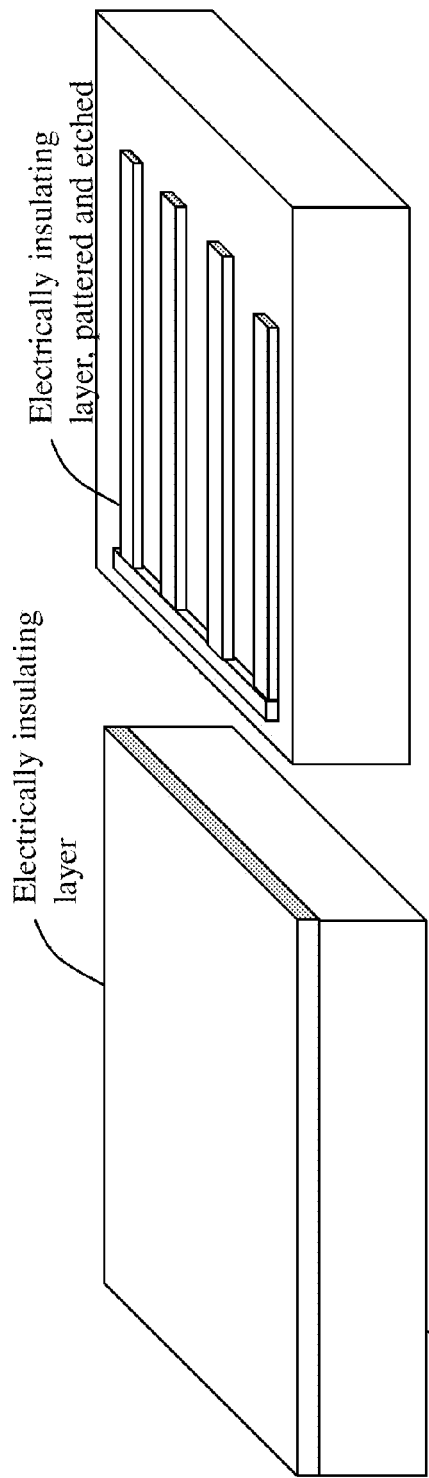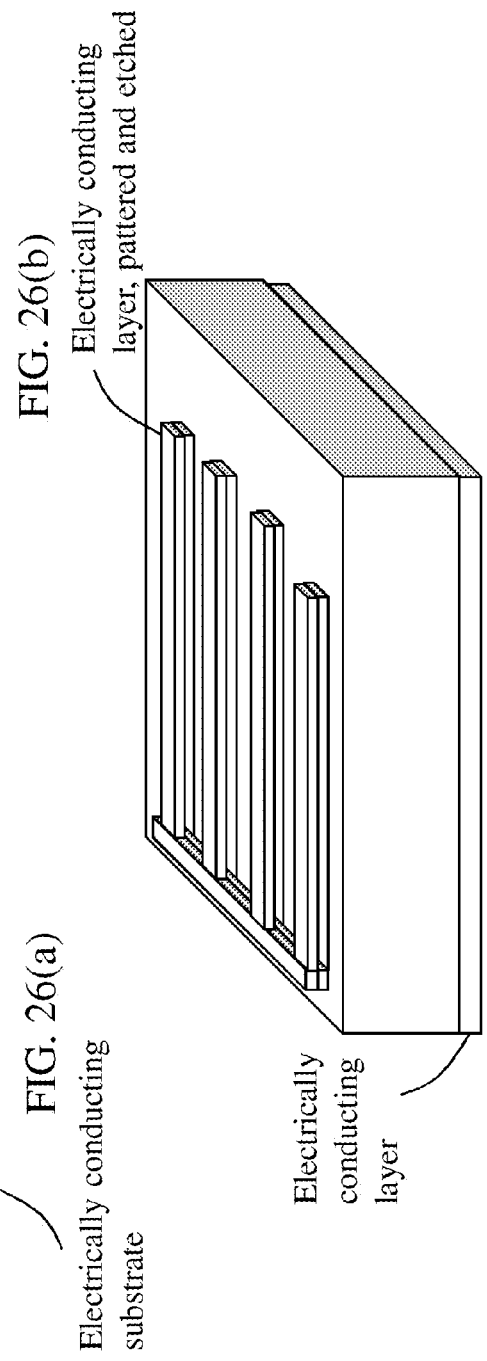
FIG. 26(a) Electrically conducting substrate / Electrically insulating layer
FIG. 26(b) Electrically insulating layer, pattered and etched
FIG. 26(c) Electrically conducting layer, pattered and etched / Electrically conducting layer

HIGHLY-RELIABLE MICRO-ELECTROMECHANICAL SYSTEM TEMPERATURE SENSOR

PRIORITY

The present U.S. Non-provisional Patent Application is related to and claims the priority benefit of U.S. Provisional Patent Application Ser. No. 61/589,120, filed Jan. 20, 2012, the contents of which is hereby incorporated by reference in its entirety into this disclosure.

STATEMENT REGARDING GOVERNMENT FUNDING

This invention was made with government support under N00178-04-D-4026 awarded by the Naval Surface Warfare Center of the United States Navy. The government has certain rights in the invention.

TECHNICAL FIELD

The present disclosure generally relates to temperature sensors, and in particular to wireless temperature sensors.

BACKGROUND

Need for measuring temperature in modern machines is prevalent. Temperature sensors of various sorts are known. Continuously monitoring a component's temperature may result in useful information about the component's remaining lifetime. While a multitude of temperature monitoring options may exist, few are appropriate for rotating machinery in harsh environment applications such as engine bearings. For instance, wired sensors including fiber optic sensors, thermocouples, and thermoelectric devices employing the Seebeck effect are not suitable for bearing monitoring because of the continuous rotation around a shaft. Infrared sensors and surface acoustic wave sensors may be suitable options for many wireless applications, but they require line-of-sight, which is often not possible within a bearing housing or other complex temperature monitoring applications. Popular approaches based on active silicon circuits become ineffective at temperatures approaching 300° C. due to the low bandgap of silicon. High-bandgap materials, on the other hand, like silicon carbide or gallium nitride suffer from high cost as well as reliability and repeatability challenges.

Furthermore, active circuits require a power source. Since elevated temperatures are typically detrimental to batteries, energy harvesting or wireless powering schemes would need to be utilized. However, many of these approaches are impracticable in environments of high temperatures.

Therefore, there is a need for a reliable temperature sensor that is small in size, can operate in high temperature environments, and be placed in moving components of a machine.

SUMMARY

A micro-electromechanical system-type (MEMS) sensor arrangement for wirelessly measuring temperatures is disclosed. The MEMS sensor arrangement includes a multimorph sensor, a sensor coil coupled to the multimorph sensor, and a readout coil configured to be magnetically coupled to the sensor coil to i) energize the sensor coil, and ii) provide a readout of the natural frequency of the multimorph sensor, the sensor coil and the readout coil.

A micro-electromechanical system-type (MEMS) wireless temperature measurement system is disclosed. The MEMS wireless temperature measurement system includes a MEMS sensor arrangement. The MEMS sensor arrangement includes a multimorph sensor, a sensor coil coupled to the multimorph sensor, and a readout coil configured to be magnetically coupled to the sensor coil to i) energize the sensor coil, and ii) provide a readout of the natural frequency of the multimorph sensor, the sensor coil and the readout coil. The MEMS wireless temperature measurement system further includes an energizing circuit configured to energize the readout coil, and a readout circuit configured to measure the natural frequency.

A method of making a micro-electromechanical system-type (MEMS) sensor arrangement for wirelessly measuring temperatures is disclosed. The method includes thermally growing an electrically insulating layer over an electrically conducting substrate, depositing an electrically conducting layer over the electrically insulating layer, patterning and etching away to generate a combination of an electrically conducting and insulating pad and a plurality of electrically conducting and insulating beams terminating and being anchored by corresponding electrically conducting and insulating pads, respectively, and etching a well area under the combinations of electrically conducting and insulating beams.

BRIEF DESCRIPTION OF DRAWINGS

FIGS. 7(a) and 7(b) are photographic images of the partially packaged and capped MEMS sensor corresponding to FIGS. 5 and 6, respectively.

FIG. 8(a) is a schematic view of the electrically conducting substrate, one electrically insulating beam positioned over and fixed to the electrically conducting substrate at one end, and one electrically conducting beam attached to the electrically insulating beam, with the electrically conducting beam and the electrically insulating beam in a released up position indicating low thermal energy being applied to the MEMS sensor resulting in low capacitance.

FIG. 8(b) is a schematic view of the MEMS sensor of FIG. 8(a), with the electrically conducting beam and the electrically insulating beam in a down position indicating high thermal energy being applied to the MEMS sensor resulting in high capacitance.

FIGS. 26(a)-26(c) are schematic views of one embodiment of manufacturing and assembly of the MEMS sensor, according to the present disclosure.

DETAILED DESCRIPTION

Figure 1:
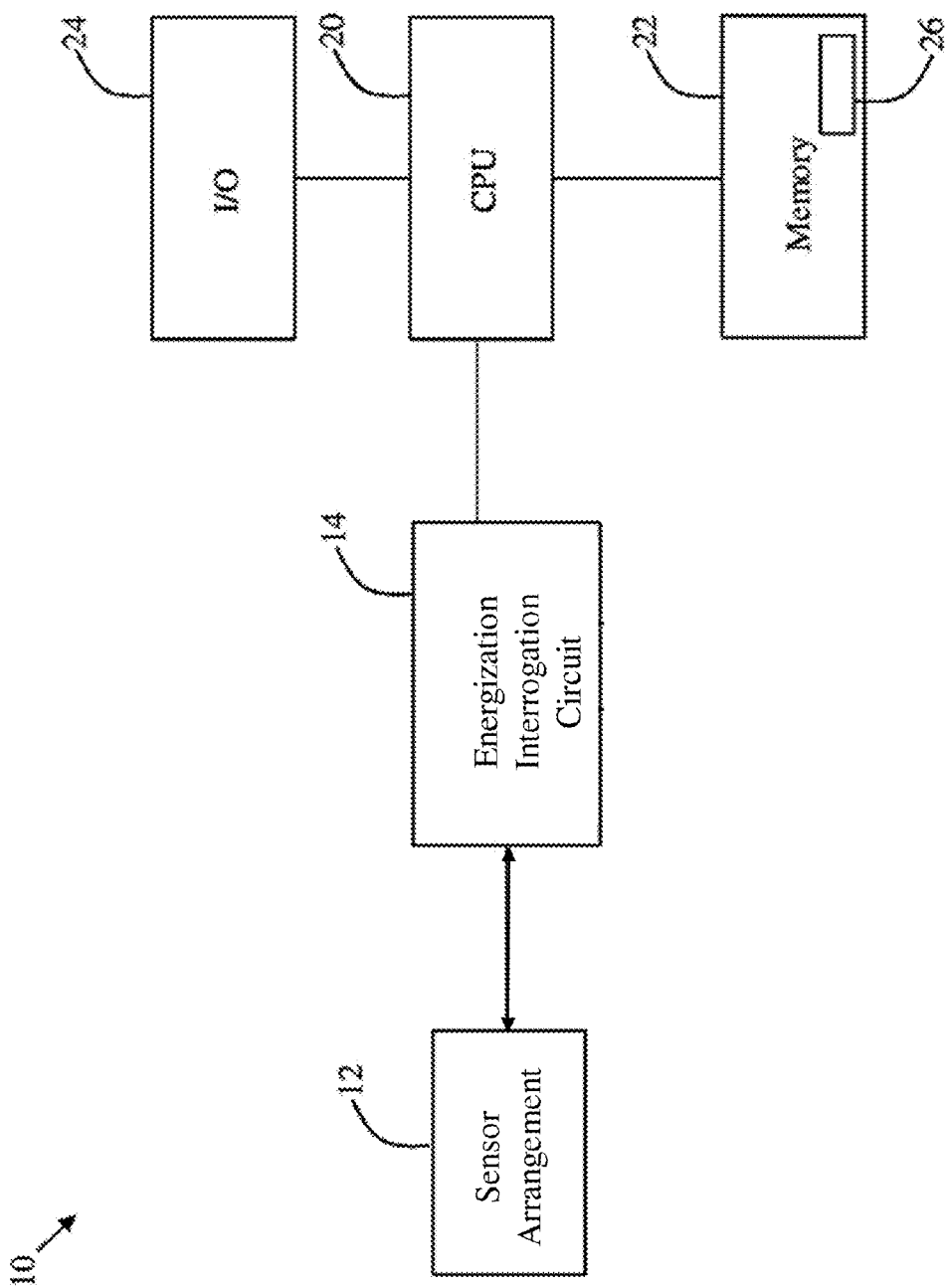
FIG. 1 is a block diagram of an exemplary system for energization and interrogation of a micro-electromechanical system-type (MEMS) sensor arrangement, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

A novel multimorph micro-electromechanical system-type (MEMS) sensor arrangement is disclosed that can overcome issues with prior art approaches of temperature measurements where there is potential for high temperatures, moving and rotating parts, and where there is no line of sight for communication with a sensor. The MEMS sensor arrangement includes a multimorph MEMS sensor which is a micro-scale beam, typically a cantilever, whose deflection is temperature-dependent. This deflection is sensed capacitively. Specifically, capacitance changes versus temperature, resulting in changes in resonant frequency versus temperature, are measured when integrated with an inductor.

FIG. 1 is a block diagram of an exemplary system for energization and interrogation of a MEMS sensor arrangement, according to the present disclosure. The system 10 includes a sensor arrangement 12, an energization-interrogation circuit block 14, a processing circuit 20, a memory block 22 and an input/output (I/O) device 24. The I/O device 24 may include a user interface, graphical user interface, keyboards, pointing devices, remote and/or local communication links, displays, and other devices that allow externally generated information to be provided to the system 10, and that allow internal information of the system 10 to be communicated externally.

The processing circuit 20 may suitably be a general purpose computer processing circuit such as a microprocessor and its associated circuitry. The memory block 22 may suitable be various memory and data storage elements associated with a general purpose computer. Within the memory block 22 are various instructions in a program instruction block 26 within the memory block 22. The processing circuit 20 is configured to execute the program instructions 26 to carry out the various operations.

The processing circuit is also connected to the I/O device 24 to receive data from, and present data to a user. The processing circuit 20 is also connected to the energization-interrogation circuit block 14 to receive data from, and send data to, the energization-interrogation circuit block 14. The data communicated between the processing circuit 20 and the energization-interrogation circuit block 14 includes the energization signal as well as the readout data (also referred to herein as the interrogation data).

The memory block 22 may include random access memory (RAM), read only memory (ROM), programmable read only memory (PROM), erasable programmable read only memory (EPROM), or electrically erasable read only memory (EEPROM), and other types of memory known in the art suitable for storing data. The data may be of the type that continuously changes, or of the type that changes during operations of the energization-interrogation circuit block 14.

Figure 2:
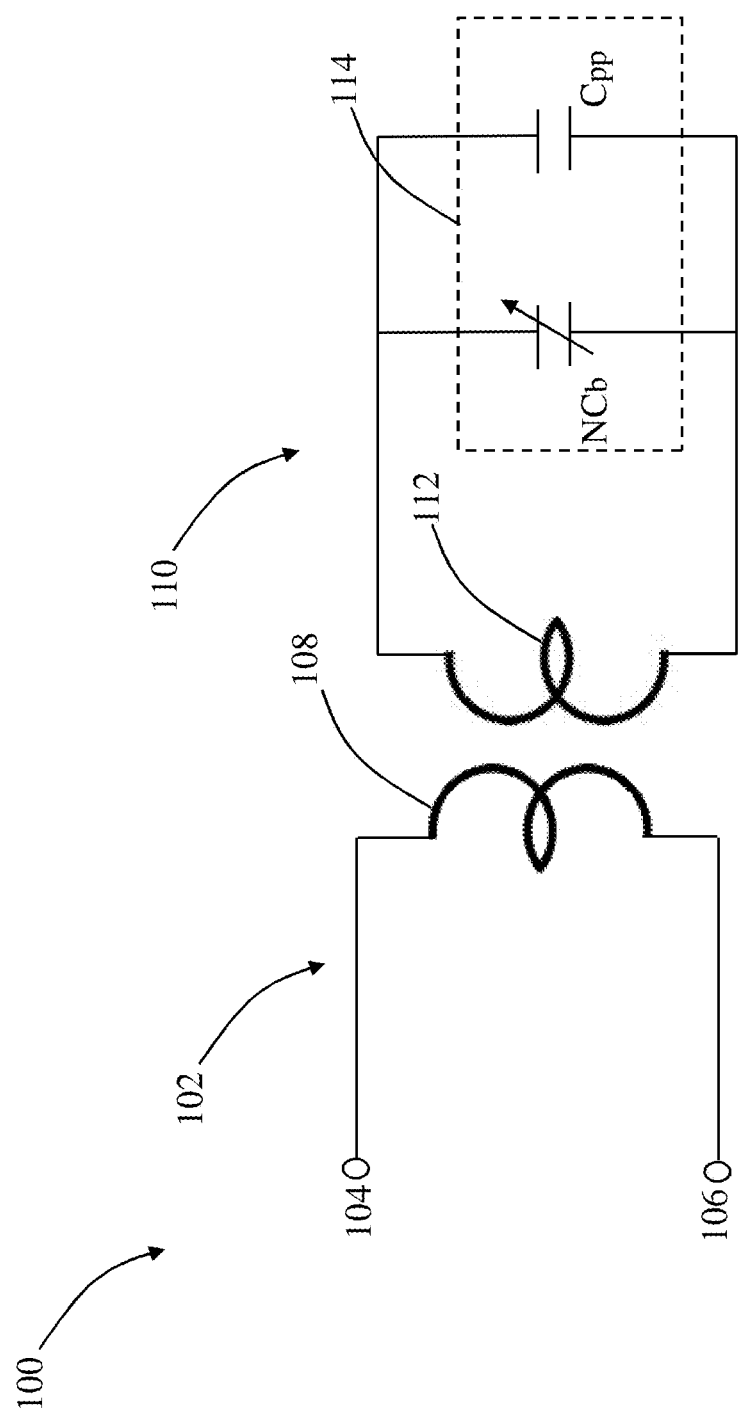
FIG. 2 is a schematic of the MEMS sensor arrangement of FIG. 1 including a MEMS sensor represented by a capacitor, a sensor coil, and readout coil.

FIG. 2 is a schematic of the MEMS sensor arrangement 12 shown in FIG. 1, referenced in FIG. 2 as 100, which includes a readout arrangement 102 and an energization arrangement 110. The readout arrangement 102 includes terminals 104 and 106, and a readout coil 108. The energization arrangement 110 includes a sensor coil 112, and a MEMS sensor 114, represented by two capacitors. The first capacitor is a static capacitor, $C_{pp}$, while the second capacitor is a thermally variant capacitor $C_b$. These capacitors are further described below with reference to FIGS. 8(a) and 8(b). The readout coil 108 and the sensor coil 112 are positioned such that these can be magnetically coupled, therefore, voltage changes in one coil can be magnetically induced into the other coil. While the readout coil 108 is coupled to the terminals 104 and 106, the sensor coil 112 is coupled to the MEMS sensor 114.

Figure 3:
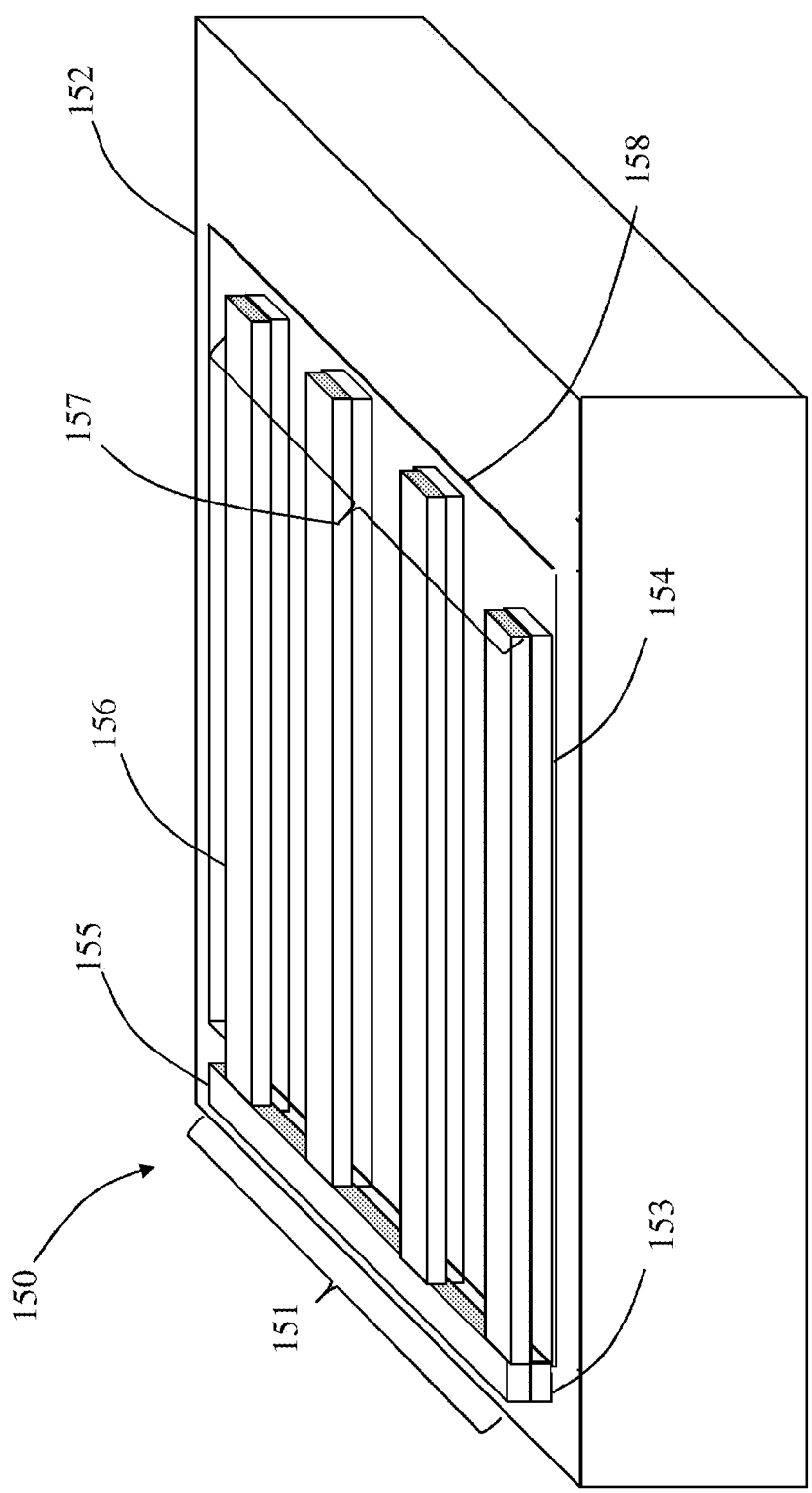
FIG. 3 is an exemplary perspective view of the MEMS sensor of FIG. 2 including an electrically conducting substrate, a plurality of electrically insulating beams positioned over and fixed to the electrically conducting substrate and a plurality of electrically conducting beams, each attached to a corresponding electrically insulating beam.

FIG. 3 is an exemplary perspective view of the MEMS sensor 114 of FIG. 2, identified as 150 in FIG. 3, including an electrically conducting substrate 152, an electrically insulating pad 153 and a plurality of electrically insulating beams 154 positioned over the and fixed to the electrically conducting substrate 152 at a first end 151. Also depicted is an electrically conducting pad 155 and a plurality of electrically conducting beams 156, each electrically conducting beam 156 being attached to a corresponding electrically insulating beam 154. It should be noted that the electrically insulating beams 154 (and therefore the electrically conducting beams 156 affixed thereto) are free to move with respect to the electrically conducting substrate at a second end 157 opposite to the first end 151. A well area 158 under the combinations of the electrically conducting and insulating beams 154 and 156, respectively, is also provided so that during severe deflections of these beams, the electrically insulating beams do not make contact with the electrically conducting substrate. The depth of the well area can range from 3-5 μm.

Figure 4:
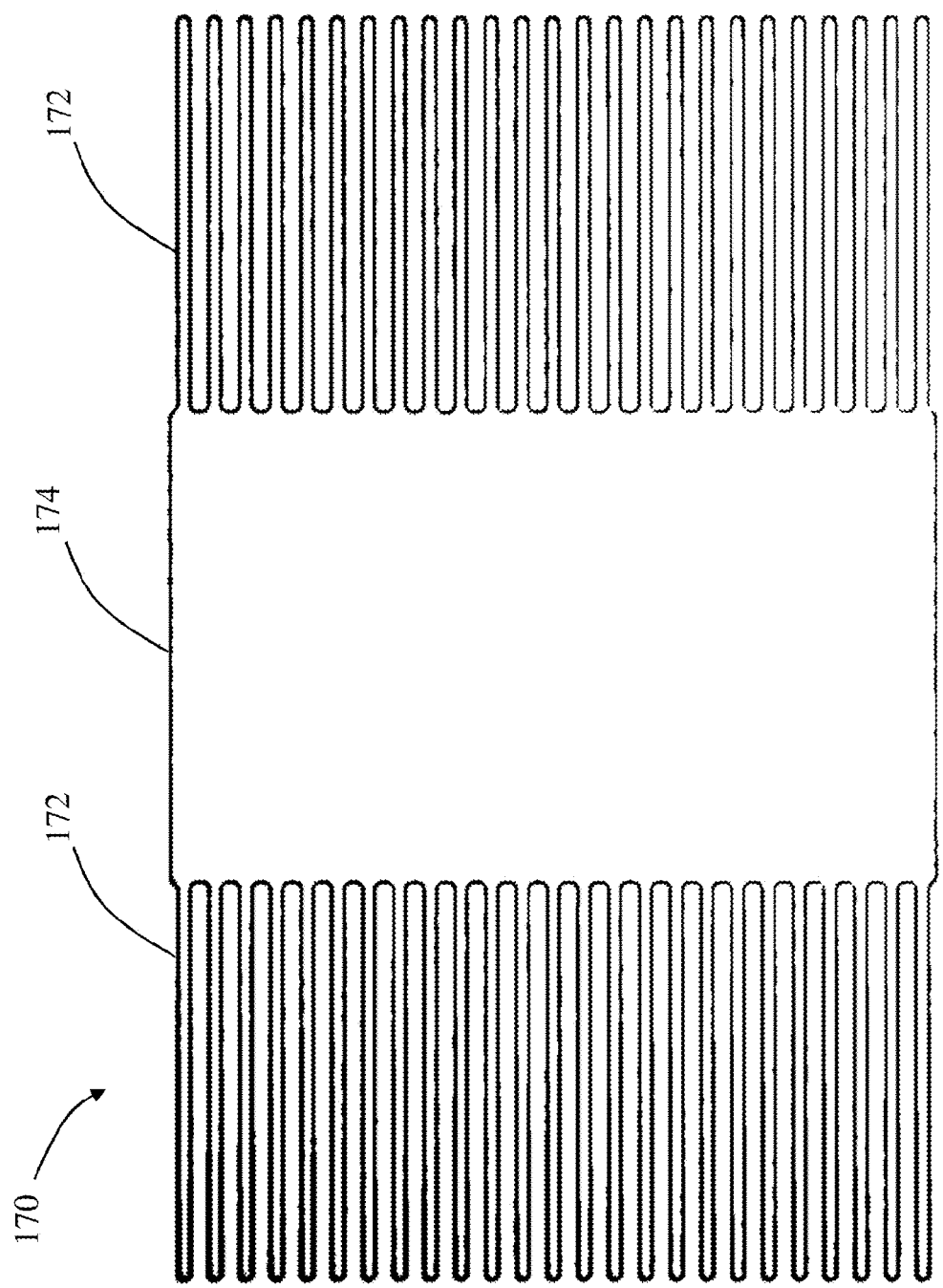
FIG. 4 is a top view of the plurality of electrically conducting beams terminating at a pad.

FIG. 4 is a top view of the plurality of electrically conducting beams 156, shown as 172 in FIG. 4, terminating at the electrically conducting pad 155, identified as 174 in FIG. 4, according to one embodiment. While dimensions of the beams and the pads can vary depending on the design characteristics, according to at least one embodiment, the electrically conducting pad can be 300 μm×500 μm. There can be 50 bimorph electrically insulating-conducting beam combinations, each combination having dimensions of 250 μm for length and 10 μm for width.

Figure 5:
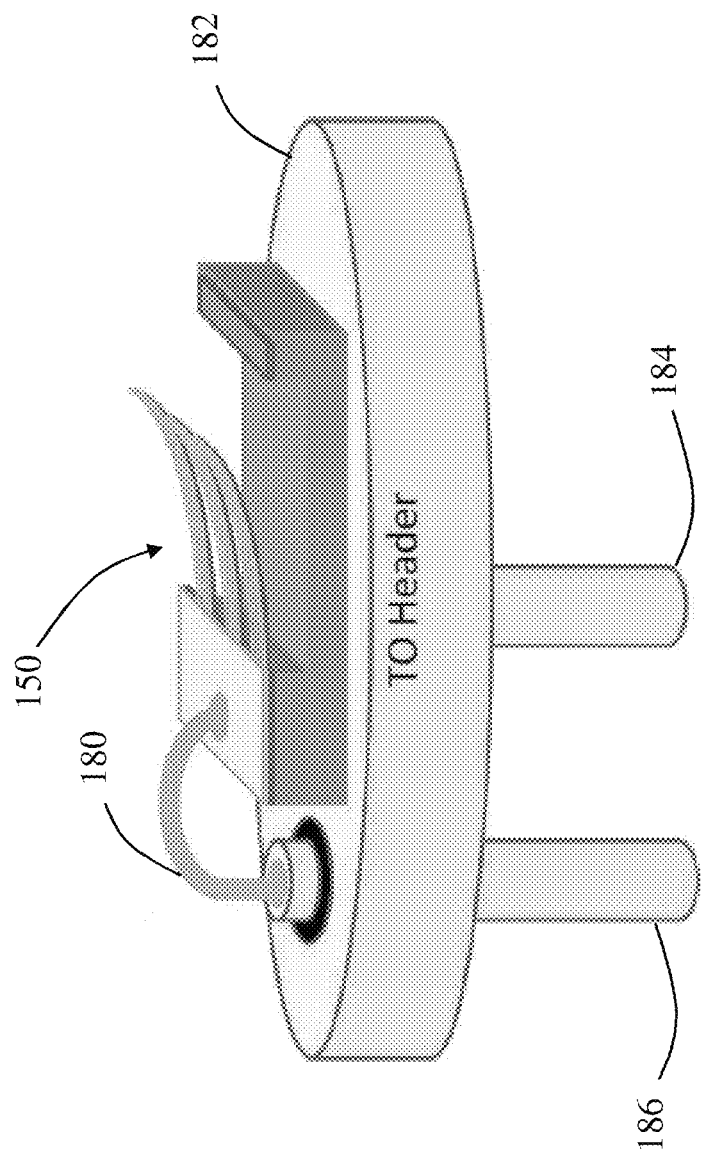
FIG. 5 is a schematic view of the MEMS sensor of FIG. 2 in one partially packaged embodiment, according to the present disclosure.
Figure 6:
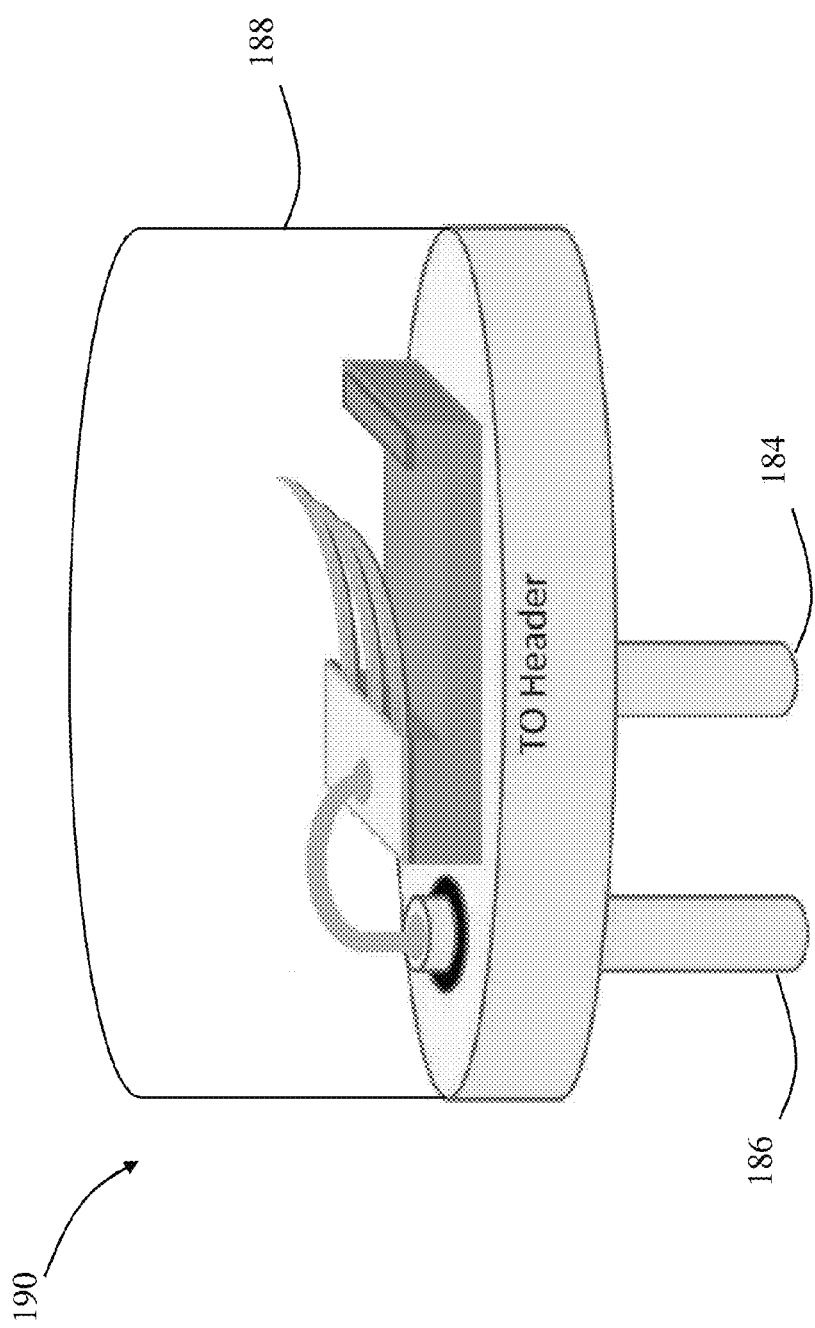
FIG. 6 is a schematic view of the partially packaged MEMS sensor of FIG. 5 with a cap placed thereon.
Figure 26D:
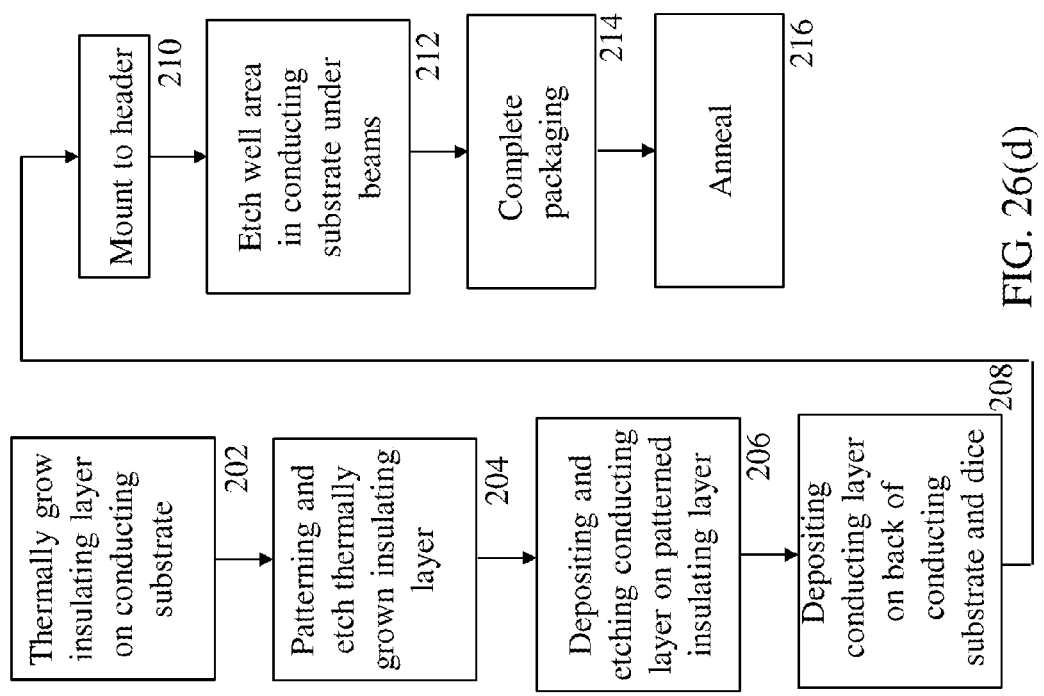
FIG. 26(d) is a block diagram of steps in fabricating and post processing the MEMS sensor including annealing.

FIG. 5 is a schematic view of the MEMS sensor 150 in one partially packaged embodiment, according to the present disclosure. The MEMS sensor 150 is attached to a commercially-available transistor outline header (TO-46) using gold-gold (Au—Au) thermo-compression bonding, known to a person having ordinary skill in the art. Bonds are successfully applied after applying several MPa of pressure for 15 minutes at 350° C. Another approach may utilize conductive epoxy to mount the MEMS sensor 150 to the package. Besides temperature limitations, conductive epoxy can be limiting to the quality factor of the capacitor. The samples are then wirebonded 180 to the TO header pin 186 of the header 182 while header pin 184 is in electrical connectivity with the electrically conducting substrate 152. The headers are next placed in a $XeF_2$ etch system and released with about 10 cycles of 15 seconds each, at 3 Torr to generated the well area 158 (see FIG. 3). Etch rate varies significantly with amount of exposed silicon (electrically conducting substrate 152, see FIG. 3). Finally, while still in the cleanroom environment, a TO cap 188 is resistively-welded to the header, hermetically-sealing the sensor as depicted in FIG. 6. More details about the fabrication, packaging and post processing steps are provided below when describing FIGS. 26(a)-26(d). In particular, FIG. 26(d) provides a block diagram of the fabrication, packaging and post processing, e.g., annealing.

FIGS. 7(a) and 7(b) are photographic images of the partially packaged MEMS sensor 150 and the capped MEMS sensor 190 corresponding to FIGS. 5 and 6, respectively.

FIG. 8(a) is a schematic view of the MEMS sensor 150, including the electrically conducting substrate 152, one electrically insulating beam 154 positioned over and fixed to the electrically conducting substrate 152 at one end 151 while free to move at another opposite end 157, and one electrically conducting beam 156 attached to the electrically insulating beam 154, with the electrically conducting beam and the electrically insulating beam in a released up position indicating low thermal energy being applied to the MEMS sensor resulting in low capacitance.

Also depicted in FIG. 8(a) are a) the static capacitor ($C_{pp}$) and b) the temperature-variable capacitor ($C_b$), alluded to above with reference to FIG. 2. The static capacitance is a simple metalinsulator-metal (MIM) capacitor. The top metal layer (gold, according to one embodiment) and insulator (thermally-grown silicon dioxide, according to one embodiment) also serve as the structural layers for the bimorph MEMS sensor 150. Typical static capacitances can range from 1 pF to 100 pF, depending on the size of pads 174, see FIG. 4. The temperature variable capacitor changes with temperature. The bottom electrode is low resistivity silicon (also referred to herein as electrically conducting substrate 152), and which is in contact with the metallic package header, as depicted in FIG. 6. As temperature is increased, the metal (i.e., the electrically conducting beam 156) in the bimorph MEMS sensor 150 expands more rapidly than the insulator (i.e., the electrically insulating beam 154), so it deflects downwards. This downward movement increases the capacitance between the bimorph and the silicon, and as a result, changes the capacitance of the entire MEMS sensor 150. It should be appreciated that the capacitors $C_b$ and $C_{pp}$ are identified herein as lumped parameters. Therefore, the overall capacitance of the MEMS sensor 150 is an overall representation/combination of these capacitors. It should be emphasized that $C_b$ in FIG. 8(a) is lower than the $C_b$ in FIG. 8(b).

One purpose of the static capacitance is to tailor the resonant frequency to the designer's desired range. The insulator and top metal film (i.e., the electrically insulating beam 154 and the electrically conducting beam 156) may be on the order of hundreds of nanometers to several microns thick. This is limited by deposition/growth and lithography based on standard device generation processes. The pad 174 (see FIG. 4) footprint is limited by the package size, and for most designs, will be from hundreds of microns to a millimeters in relative dimensions. However, the dimension can be chosen such that the static capacitor ($C_{pp}$) results in more robust measurements of the temperature-variable capacitor ($C_b$). To recap, $C_{pp}$ is a simple MIM capacitor, and is approximately constant with changes in temperature. The construction of the MEMS sensor 150, particularly with regards to dimensions of the pads (electrically insulating and conducting pads 153 and 155, respectively) determine the size of $C_{pp}$ which is used both to anchor the bimorph beams, and to tailor the starting resonant frequency when integrated with an inductor (e.g., sensor coil 112, see FIG. 2). $C_b$, is the capacitance which changes with changes in temperature.

To determine the capacitance of the beam as temperature changes, the profile of the beam needs to be determined first. Design equations are stated below. Maximum capacitance occurs when the bimorph is just above the substrate. To ensure reliable performance, contact with the substrate is avoided in this design. Thus, the maximum operating temperature of the beam occurs when the bimorph beams are approximately flat. As a result, the beam materials and dimensions are designed such that the tip height is zero at or above the maximum desired operating temperature.

Equations for deflection of bimorph structures and capacitance versus temperature are outlined here. Because all multimorph structures considered in this work are either 2 or 3 layers, we simplify the equations for those cases. First we define $I_i$ as the moment of inertia of layer i, which for a cantilever is:

$$I_i = \frac{w_i t_i^3}{12}$$

where $w_i$ is the width, and $t_i$ is the thickness of layer i. For wide beams (w>5t), we use the plate Young's modulus, and an isotropic Poisson's ratio ($v_i$)

$$E_i \rightarrow \frac{E_i}{1-v_i^2}$$

The radius of curvature ($\rho$) is derived as:

$$\frac{1}{\rho} = \frac{2RA^{-1}S}{2+RA^{-1}B}$$

where $$R = \frac{-1}{\sum_{i=1}^{n} E_i I_i} \left[ \left(\frac{t_1}{2}\right)\left(t_i + \frac{t_2}{2}\right)\left(t_2 + \frac{t_3}{2}\right) \right]$$

$$A = \begin{bmatrix} \frac{1}{E_1 A_1} & \frac{-1}{E_2 A_2} & 0 \\ 0 & \frac{1}{E_2 A_2} & \frac{-1}{E_3 A_3} \\ 1 & 1 & 1 \end{bmatrix}$$

$$B = [t_1 + t_2 \quad t_2 + t_3 \quad 0]^T$$

$$S = [\varepsilon_2 - \varepsilon_1 \quad \varepsilon_3 - \varepsilon_2 \quad 0]^T$$

$A_i$ is the axial cross-section area of layer i, and $\varepsilon_i$ is the induced strain. This strain term is dependent on the stress applied, and is $$\varepsilon_i = -\frac{\sigma_i}{E_i} \text{ for residual stress}$$

$$\varepsilon_i = \alpha_i \Delta T \text{ for thermal effect}$$

Here, $\sigma_i$ is the residual stress of layer i, $\alpha_i$ is the thermal expansion coefficient (CTE), and $\Delta T$ is the change in temperature. Finally, we can extract simple Cartesian coordinates from the radius of curvature and obtain $$x = L - \rho \cdot \sin\left(\frac{L}{\rho}\right)$$

$$y = -\rho\left(1 - \cos\left(\frac{L}{\rho}\right)\right)$$

The static capacitance, $C_{pp}$ is due to the pad which anchors the bimorph structures. Because of the surface area of the pad (A) compared to the thickness of the insulator (t), a parallel-plate approximation for this static capacitance is appropriate, and is:

$$C_{pp} = \frac{\varepsilon_0 \varepsilon_r A}{t}$$

where $\varepsilon_0$ is the free-space permittivity and $\varepsilon_r$ is the relative permittivity of the medium. If multiple different insulators are stacked, the total capacitance can be calculated as series capacitances.

In the derivation of the capacitance of a beam, pure bending is assumed, so each cantilever is a circular arc of length Lc (beam length).

$$d = \rho + gap$$

$$a = \sqrt{d^2 - \rho^2}$$

$$x_b = \frac{x_c^2 + y_c^2 - a^2}{2x_c}$$

$$r_b = \sqrt{x_b^2 + a^2}$$

$$x_c = \rho \cdot \sin\left(\frac{x}{\rho}\right)$$

$$y_c = gap + \rho\left(1 - \cos\left(\frac{x}{\rho}\right)\right)$$

In the derivation of the capacitance of a beam, pure bending is assumed, so each cantilever is a circular arc of length Lc (beam length)

$$d = \rho + gap$$

$$a = \sqrt{d^2 - \rho^2}$$

$$x_b = \frac{x_c^2 + y_c^2 - a^2}{2x_c}$$

$$r_b = \sqrt{x_b^2 + a^2}$$

$$x_c = \rho \cdot \sin\left(\frac{x}{\rho}\right)$$

$$y_c = gap + \rho\left(1 - \cos\left(\frac{x}{\rho}\right)\right),$$

and the complete equivalent parallel-plate distance, h, is obtained using:

$$\theta_r = \cos^{-1}\left(\frac{(x_c - x_b)}{\sqrt{(x_c - x_b)^2 + y_c^2}}\right)$$

$$g = r_b \cdot \theta_r$$

$$h = g + \frac{t_1}{\varepsilon_{r,1}} + \frac{t_2}{\varepsilon_{r,2}} + \ldots$$

where $0 \le x \le Lc$, and $\varepsilon_{r,i}$ is the relative permittivity of the dielectric of layer i. Next, the capacitance per unit length of the cantilever which takes into account fringing-fields is used:

$$C_l = \varepsilon_0\left[\frac{w}{h} + 0.77 + 1.06\left(\frac{w}{h}\right)^{0.25} + 1.06\left(\frac{t}{h}\right)^{0.5}\right]$$

and integrating the individual unit section capacitance along the length of the beam gives the total capacitance for a beam:

$$C_b = \int_0^{L_c} C_l(L)dL$$

where $dL = L_c/$number of discretized sections.

Finally, by multiplying by the number of beams (N), we obtain the entire capacitance as a function of temperature due to the bimorph structures. The sensor then has a temperature-dependent capacitance with a static offset, given by:

$$C(T) = C_{pp} + N \cdot C_b(T)$$

Note that in all of these examples the relative permittivity of the dielectric films is considered to be constant with temperature. If sufficiently-high temperatures are reached (depending on dielectric used), this may not be the case, and variance of Cpp with temperature can then be accounted for.

Figure 9:
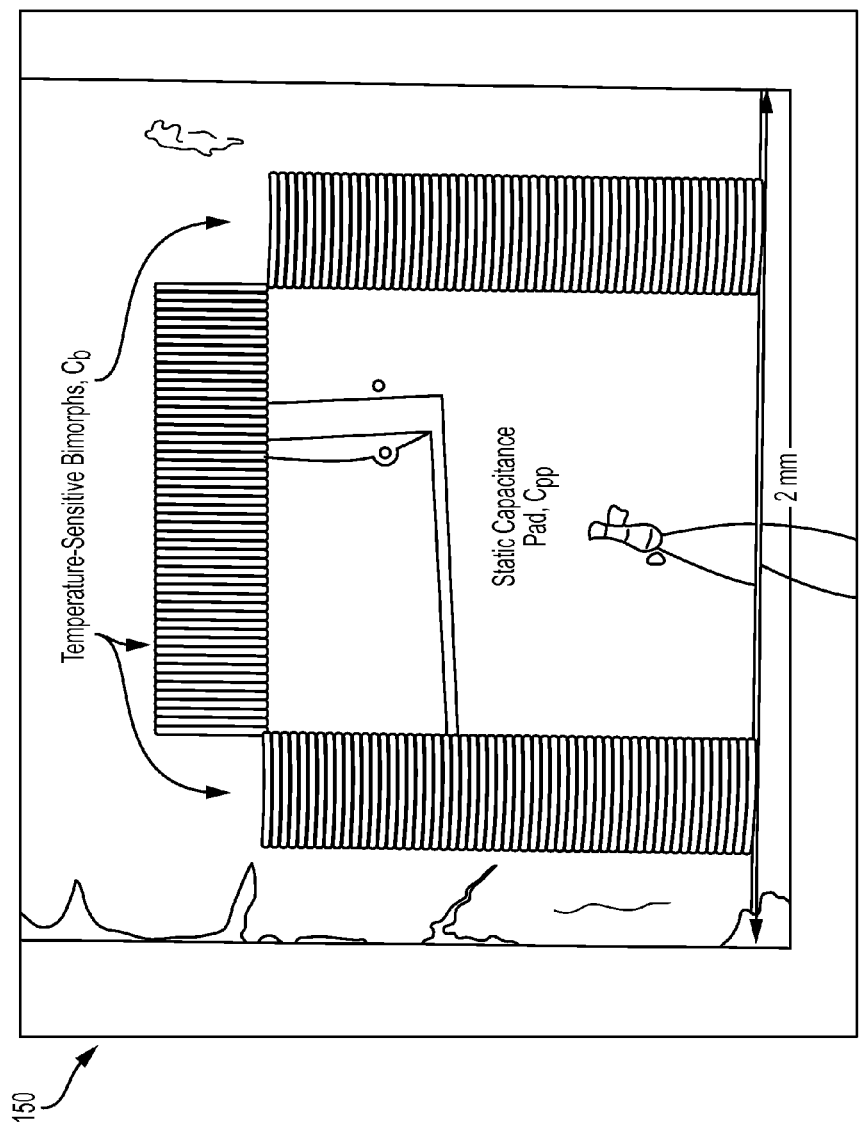
FIG. 9 is a photographic image of one embodiment of the MEMS sensor, according to the present disclosure.

FIG. 9 is a top view of a MEMS sensor 150. As discussed above, the silicon substrate is conductive, and acts as the fixed electrode, while the bimorph beams (154 and 156, see FIG. 3) move as temperature changes.

Figure 10:
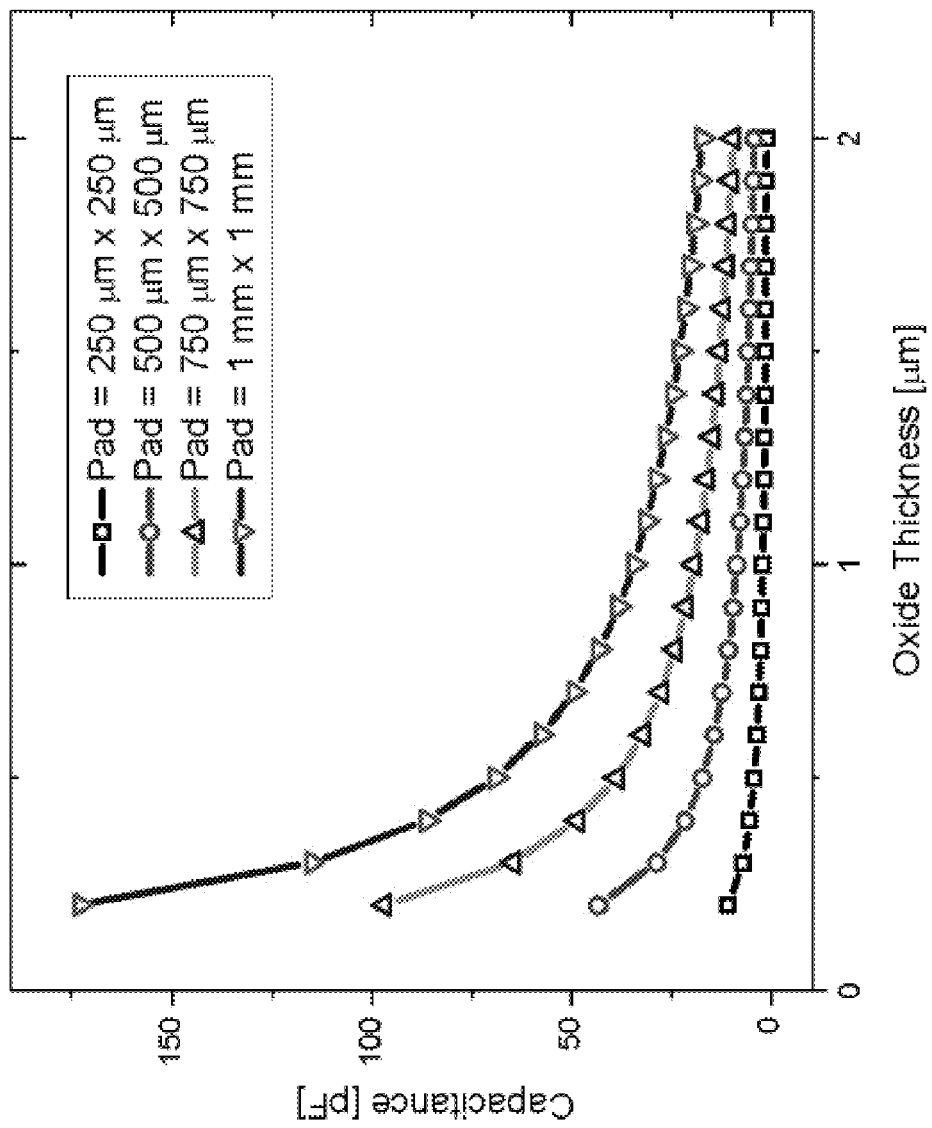
FIG. 10 is a graph of capacitance measured in pF vs. oxide thickness (representing the electrically insulating beam) measured in μm for various size pads (see FIG. 4 for the corresponding pad of the electrically conducting beams).

FIG. 10 is a graph of the MEMS sensor 150 capacitance measured in pF vs. oxide thickness (representing the electrically insulating beam) measured in μm for various size pads 153 and 155. Capacitances around 10-100 pF can be readily achieved.

Figure 11:
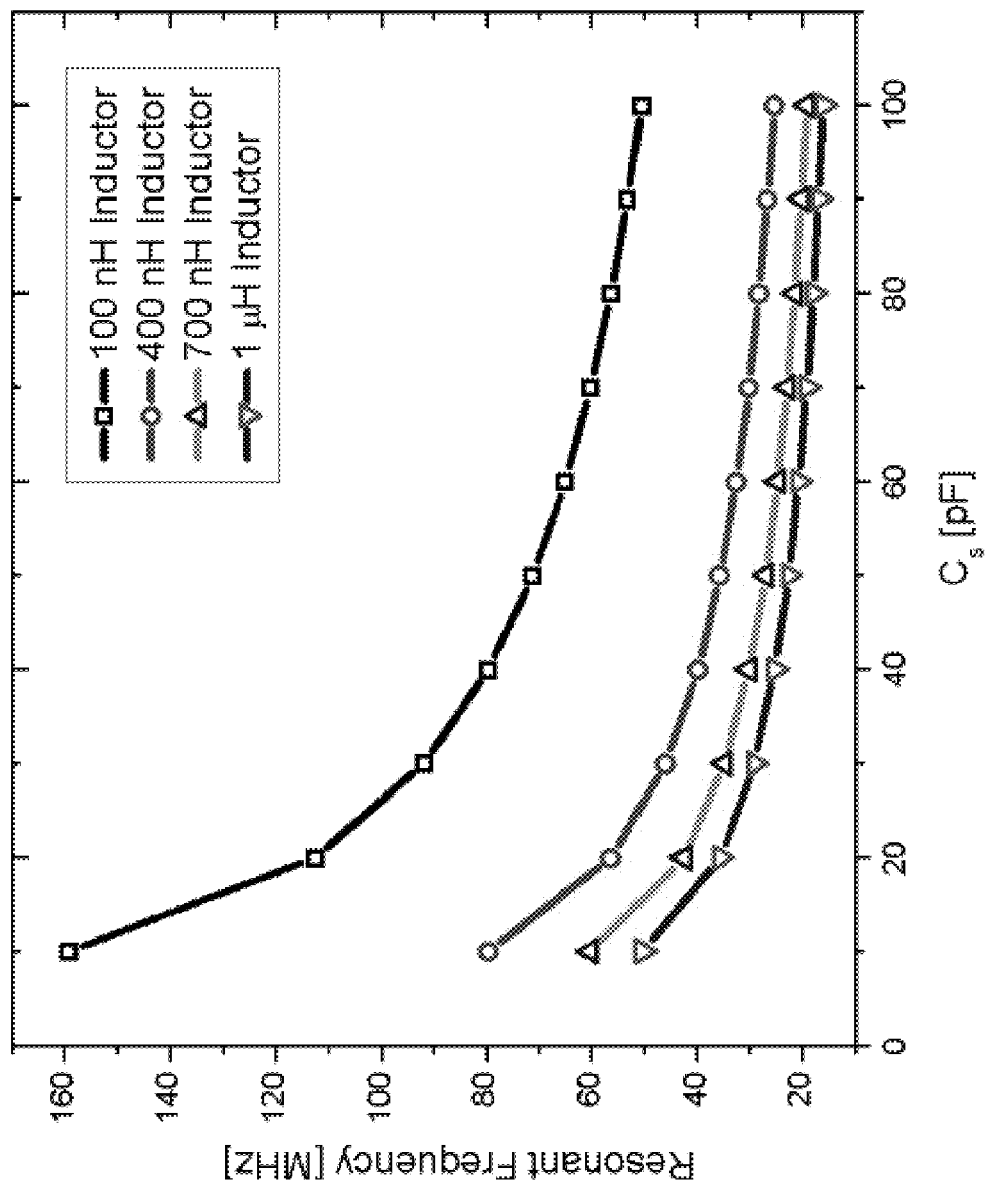
FIG. 11 is a graph of resonant frequency of the readout coil, the sensor coil, and the capacitor of the MEMS sensor, as depicted in FIG. 2, measured in MHz vs. the capacitance of the MEMS sensor measured in pF for various inductances of the sensor coil.

FIG. 11 is a graph of resonant frequency of the readout coil 108, the sensor coil 112, and the capacitor 114 of the MEMS sensor 150, as depicted in FIG. 2, vs. the capacitance of the MEMS sensor 150 measured in pF for various inductances of the sensor coil. The MEMS sensor 150 is integrated with an inductor (coil sensor 112) to form an LC resonator, which is attached directly to a machine component (i.e., a bearing cage as discussed below). As a result, the inductance of the coil is directly related to the size of the machine component (e.g., the bearing). In the case of bearings, size of most bearings range from a few centimeters to tens of centimeters. This relationship results in an inductance from around 100 nH to 1 μH depending on the number of turns of the sensor coil 112. As can be seen from FIG. 3, the resulting resonant frequency will typically be from 10 MHz to 100 MHz.

Figure 12:
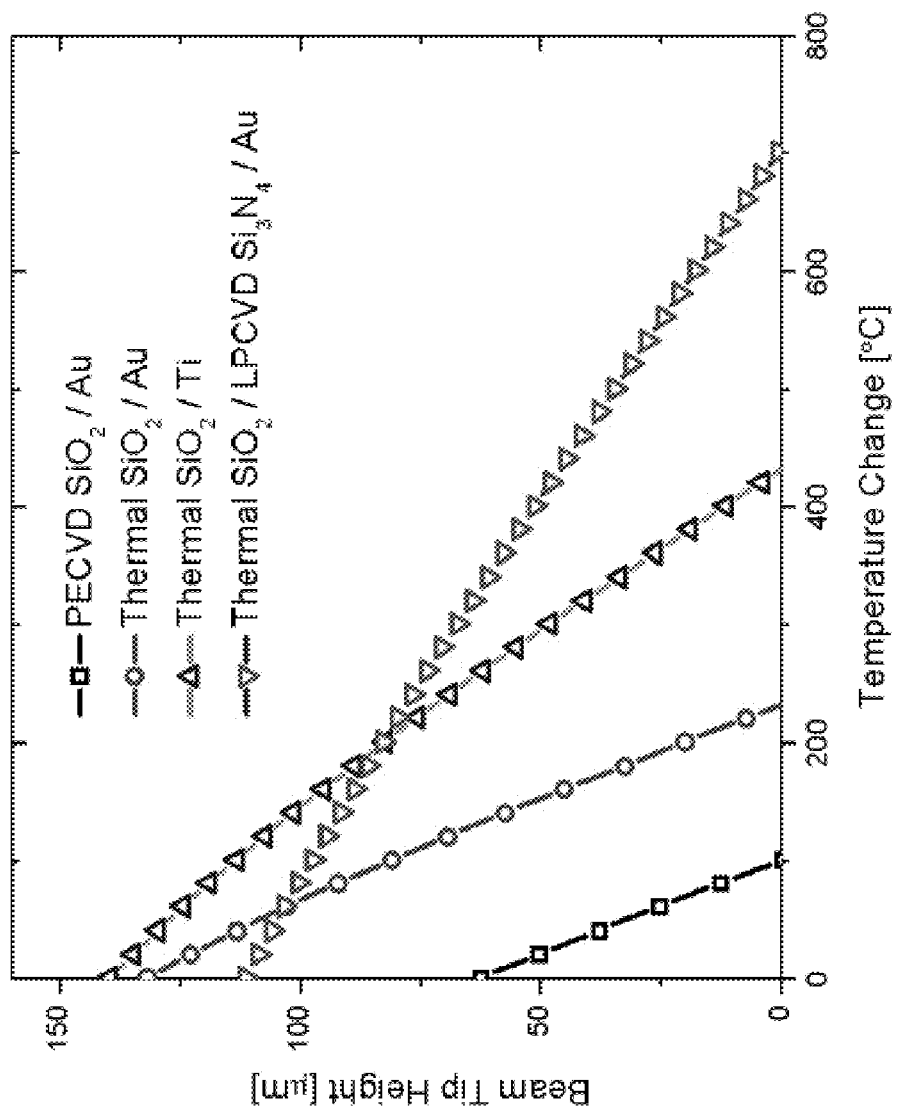
FIG. 12 is a graph of height of the beams (i.e., electrically insulating and conducting beams) form the surface of the electrically conducting substrate measured in μm vs. temperature change measured in °C. for various combinations of materials for the electrically insulating and conducting beams.

FIG. 12 is a graph of height of the beams (i.e., electrically insulating and conducting beams 154 and 156, respectively) form the surface of the electrically conducting substrate 152 measured in μm vs. temperature change measured in ° C. for various combinations of materials for the electrically insulating and conducting beams. FIG. 12 shows several different variations assuming material properties identified in Table I. All film thicknesses are 0.5 μm, beam lengths are 250 μm, and beam widths are 10 μm. FIG. 12 clearly indicates that a variety of temperature ranges can be achieved by appropriately selecting the cantilever's dimensions.

TABLE I

LIST OF MATERIAL PROPERTIES FOR THERMAL MULTIMORPH CANTILEVER MODELING

| | Gold (Au) | Titanium (Ti) | Thermally-grown Silicon dioxide ($SiO_2$) | PECVD Silicon dioxide ($SiO_2$) | LPCVD Silicon Nitride ($Si_3N_4$) |
|---|---|---|---|---|---|
| Young's Modulus: E (GPa) | 57 | 116 | 70 | 70 | 270 |
| Poisson's ratio: υ | 0.42 | 0.32 | 0.17 | 0.17 | 0.27 |
| Coefficient of Thermal Expansion: α ($10^{-6}$/K) | 15.2 | 8.6 | 0.5 | 0.5 | 3.3 |
| Residual Stress: σ (MPa) | −50 | −50 | −280 | −150 | −100 |
| Relative Permittivity ($\varepsilon_r$) | | | 3.9 | 3.9 | 7.5 |

Figure 13:
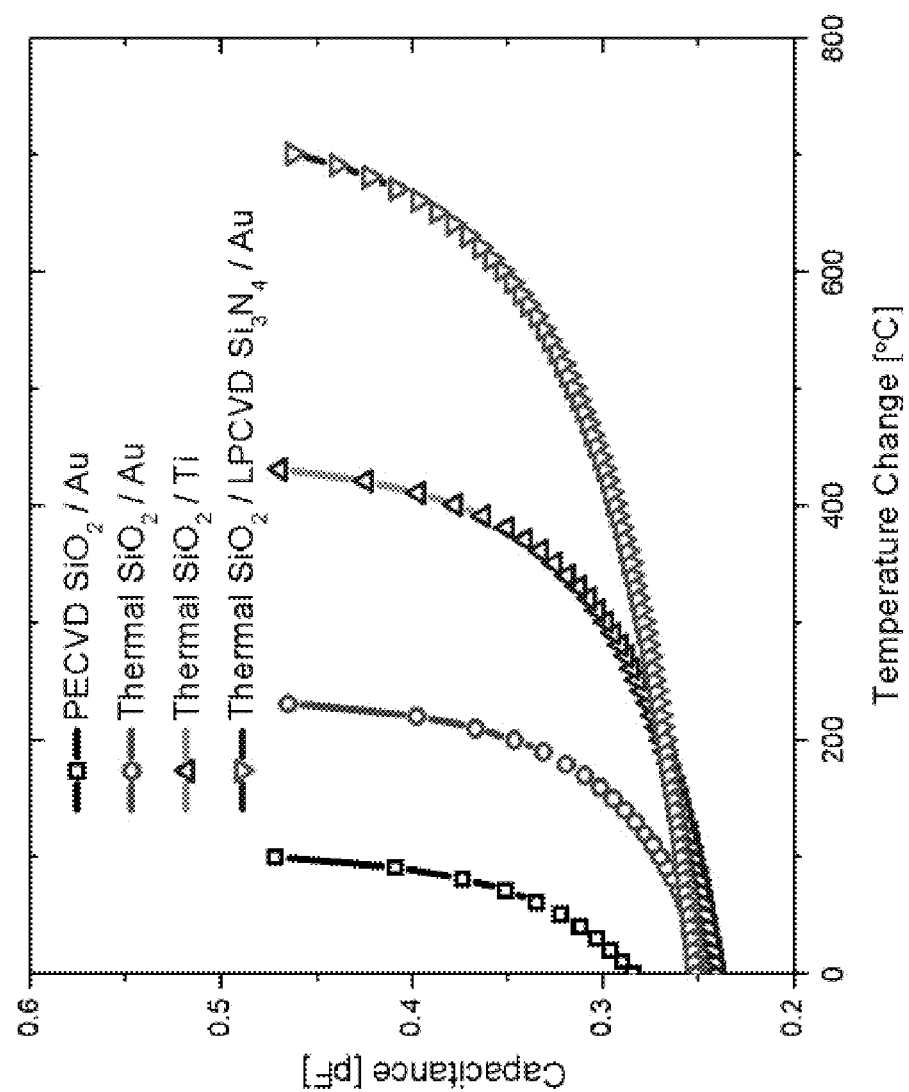
FIG. 13 is a graph of MEMS sensor capacitance measured in pF vs. temperature change measured in °C. for various combinations of materials for the electrically insulating and conducting beams.

FIG. 13 is a graph of MEMS sensor capacitance measured in pF vs. temperature change measured in ° C. for various combinations of materials for the electrically insulating and conducting beams 154 and 156, respectively. FIG. 13 shows the expected capacitance-temperature profiles for an array of 50 of the multimorph beams from FIG. 12.

Figure 14:
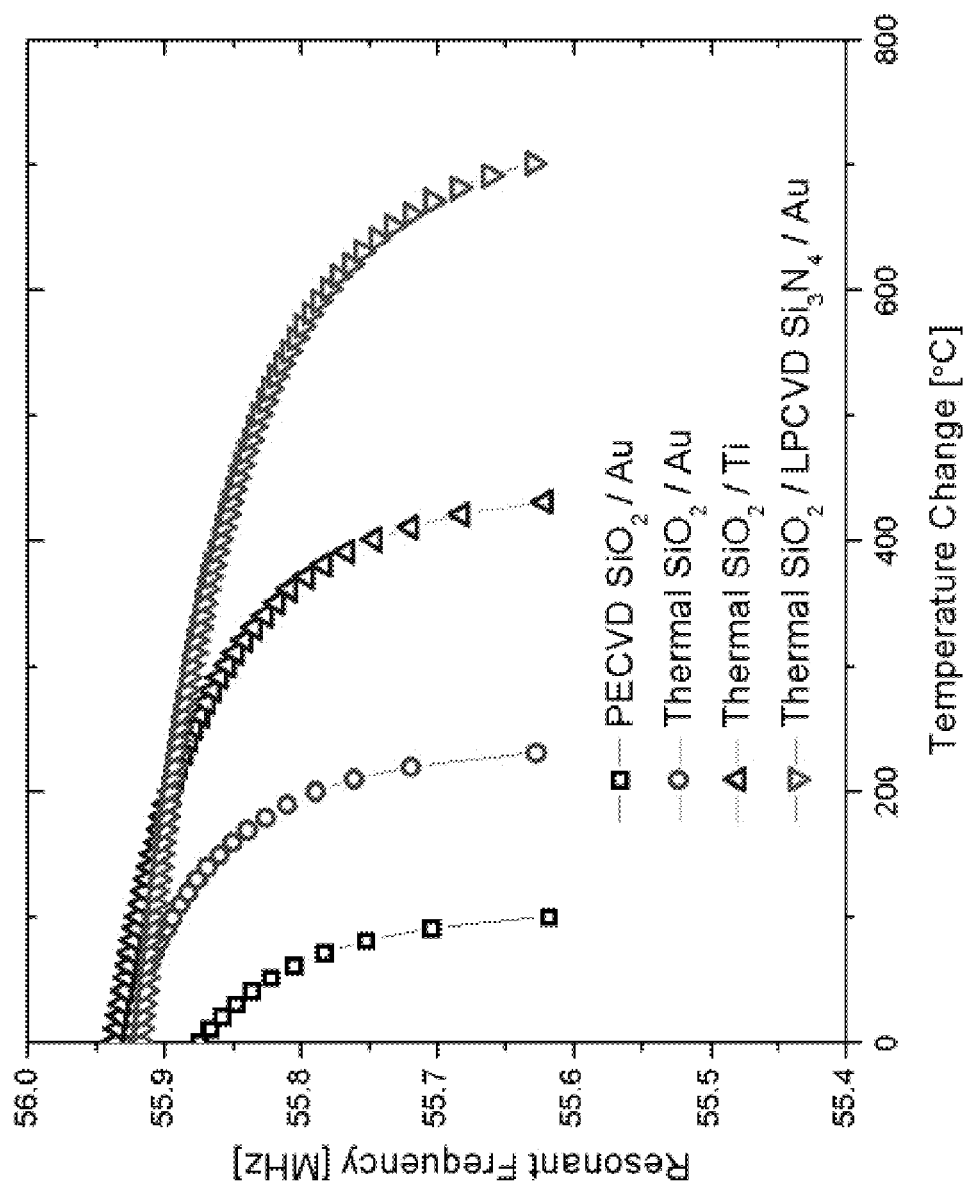
FIG. 14 is a graph of the natural frequency of the capacitance of the MEMS sensor, the sensor coil and the readout coil measured in MHz vs. temperature change measured in °C. for various combinations of materials for the electrically insulating and conducting beams.
Figure 15:
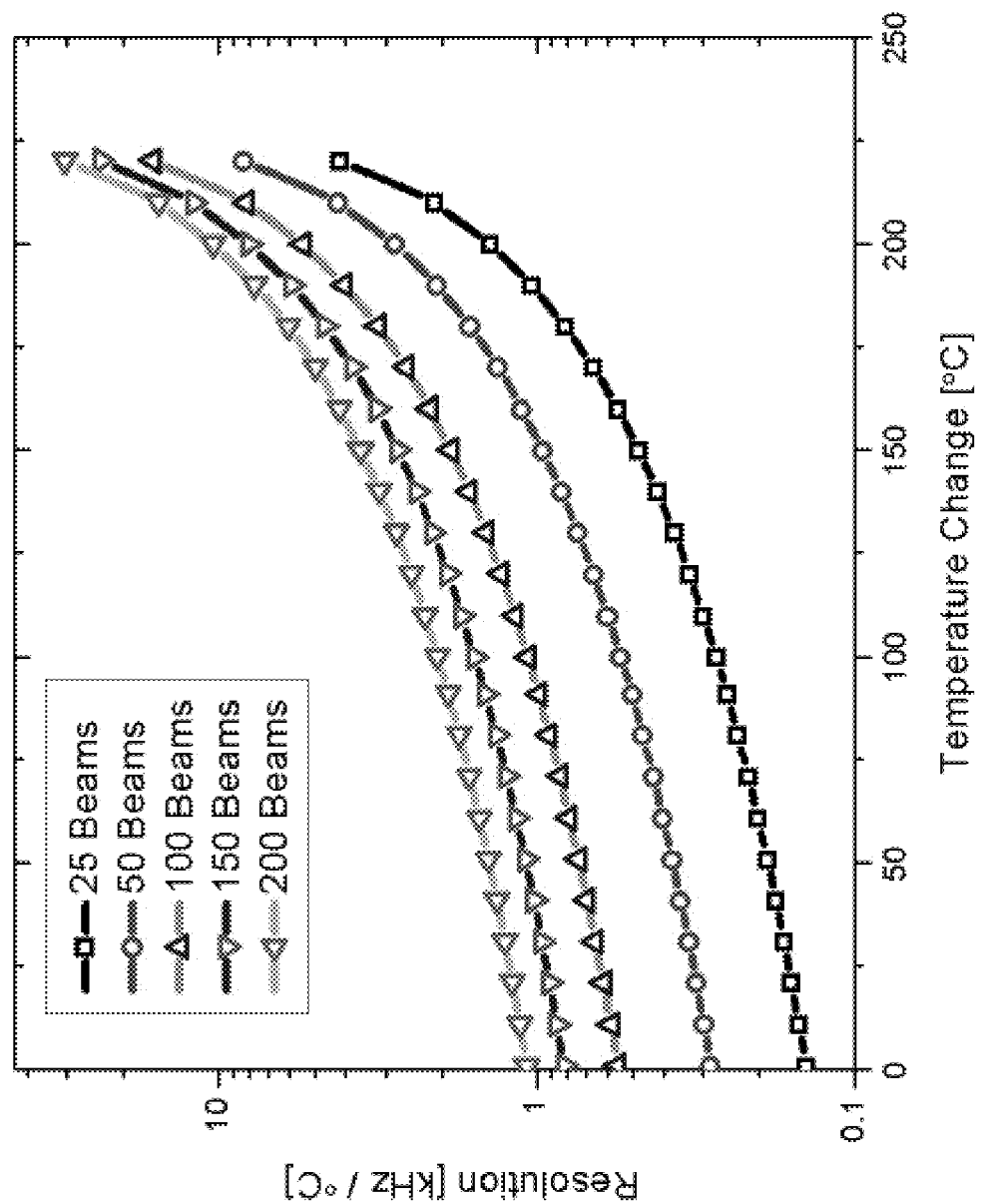
FIG. 15 is a graph of the resolution of the natural frequency of FIG. 14 measured in kHZ/°C. vs. temperature change measured °C. for various numbers of beams (i.e., combinations of electrically insulating and conducting beams).

FIG. 14 is a graph of the natural frequency of the capacitance of the MEMS sensor, the sensor coil and the readout coil measured in MHz vs. temperature change measured ° C. for various combinations of materials for the electrically insulating and conducting beams. The Resonant frequency versus temperature is with an integrated 400 nH inductor, based on a static capacitance $C_{pp}$ of 20 pF. Note that even the thermal—$SiO_2$/LPCVD $Si_3N_4$/Au device has better than 0.1 kHz/° C. resolution at room temperature The resolution may also be increased by increasing the number of beams in the array of beams. FIG. 15 is a graph of the resolution of the natural frequency of FIG. 14 measured in kHZ/° C. vs. temperature change measured in ° C. for various numbers of beams (i.e., combinations of electrically insulating and conducting beams). However, the number of beams is bounded by the desired chip size as well as the maximum frequency shift that can be read by a receiver device.

Figure 16:
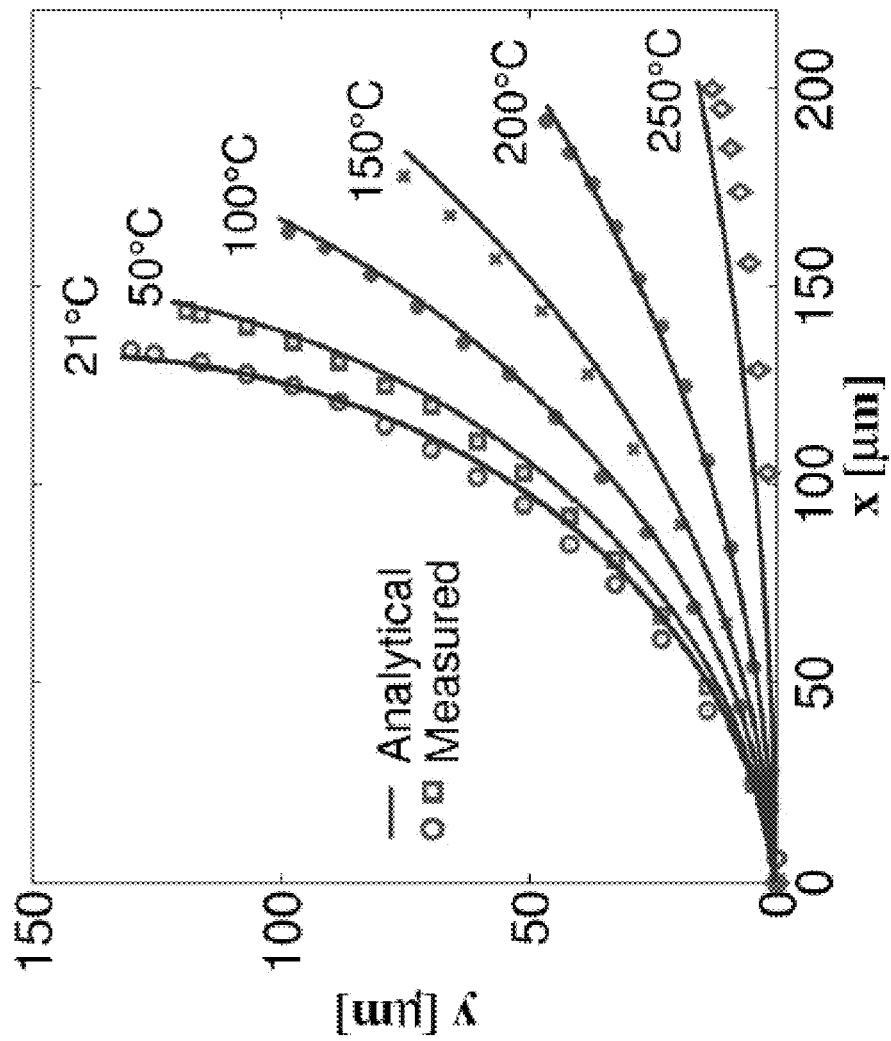
FIG. 16 is a graph of actual beam deflections (i.e., combinations of electrically insulating and conducting beams) measured in μm vs. analytical deflections measured in μm for various temperatures.

The displacement of the fabricated cantilevers has been experimentally measured using a LEXT laser confocal microscope. The beam profiles at different temperatures have been compared to the analytical models. FIG. 16 is a graph of actual beam deflections (i.e., combinations of electrically insulating and conducting beams) measured in μm vs. analytical deflections measured in μm for various temperatures. FIG. 16 shows the beam deflections of a bimorph (w=10 μm, L=250 μm) compared to the analytical model. At all temperature values, average errors are under 4% at the beam midpoints and 3% at the beam tips. The maximum temperature error in deflection occurs at 150° C. and is about 4° C. Median error is less than 1° C., with the mean error being around 1.5° C.

Referring back to FIG. 4, it shows an example of a fabricated sensor. The pad 174 dimensions are 300 μm×500 μm, and there are 50 bimorph beam combinations of length L=250 μm, and width w=10 μm. The $SiO_2$ layer (electrically insulating material) is grown to 0.5 μm thick, and the Au layer (electrically conducting layer used for constructing the beams 172) is measured to be 0.4 μm thick. While the gap parameter in the analytical model assumes a perfectly-flat ground plane, this is not case in this situation. This is due to the fact that since the substrate is used as the second electrode, it is not perfectly flat due to the non-uniform $XeF_2$ dry etch process. If the $XeF_2$ dry etch process were ideal, a 5 μm gap would be obtained for a 10-μm wide beam. In practice this depends on the particular machine, process and sample size. For our case an average etch depth of gap=4 μm is used for calculations.

Figure 17:
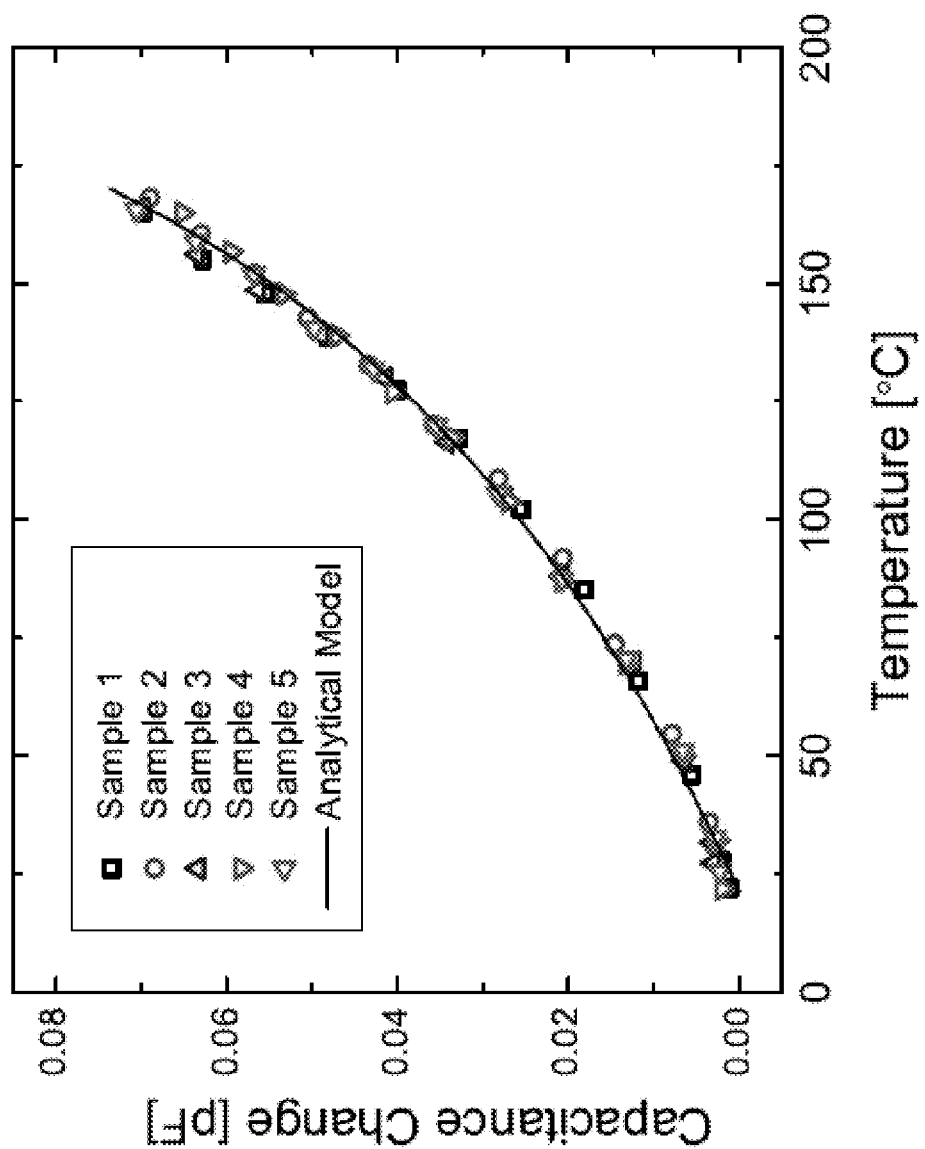
FIG. 17 is a graph of capacitance measurements of the MEMS sensor measured in pF vs. temperature for various samples.
Figure 18:
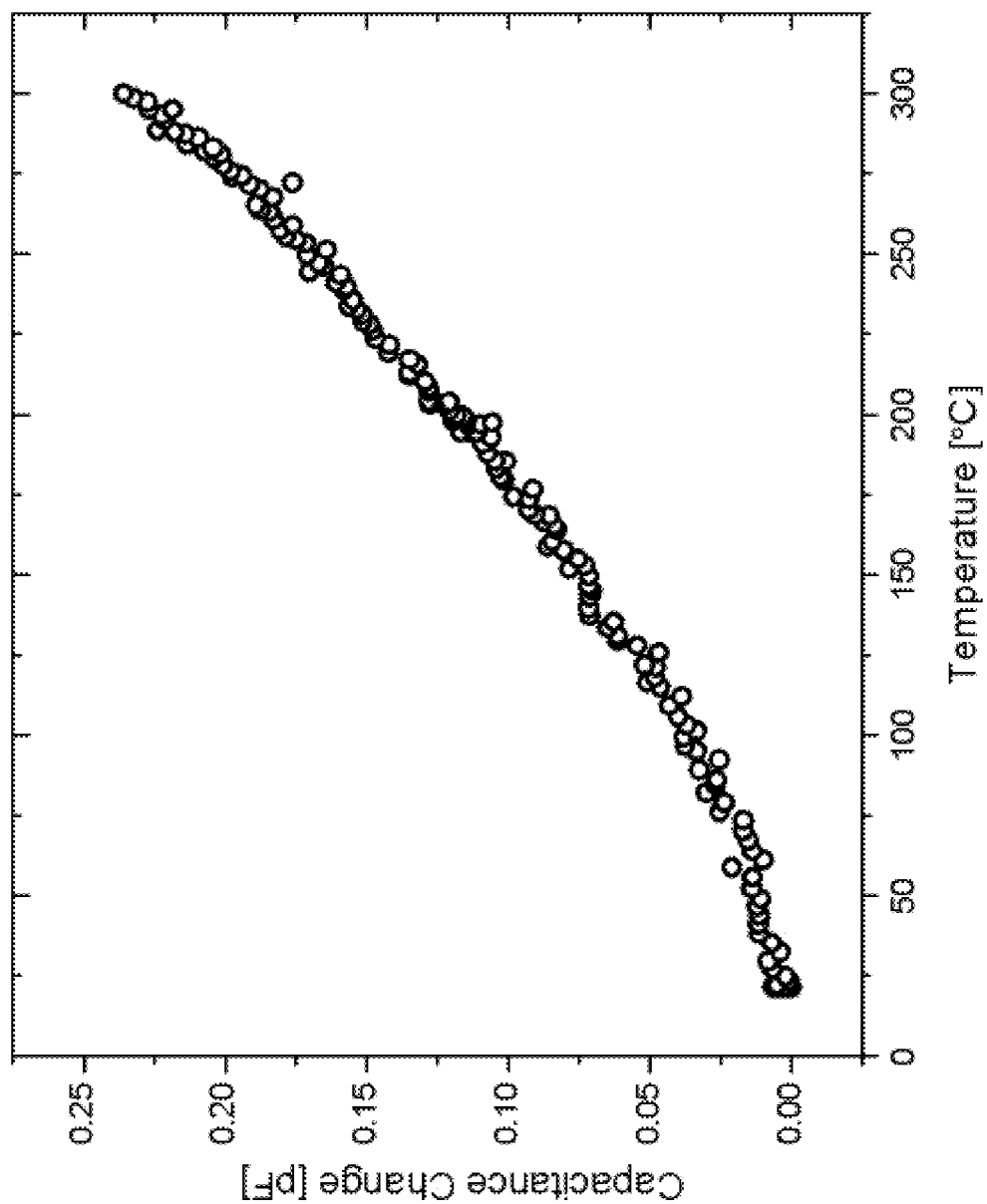
FIG. 18 is a graph of capacitance change of the MEMS sensor measured in pF vs. temperature.

At room temperature, the measured mean capacitance of 5 devices is 9.46 pF, with a standard deviation of 0.12 pF. The sensor capacitance versus temperature is measured by connecting wires (approximately 10-cm long) to pins of a socket, and placing the sensor in the socket. This method is used so that sensor leads do not need to be individually attached to each device. The wires from the socket connect the sensor to the capacitance-voltage (CV) meter through the ports in the oven. An open calibration is performed without the sensor in place to extract parasitics from the socket and wires. The sensor is then placed in an oven directly above a large metal block. An external thermocouple is placed adjacent to the sensor. The block acts as a thermal black-body, ensuring the sensor and thermocouple are at the same temperature throughout the heating and cooling process. The oven temperature is then changed to the desired set-point and the capacitance and temperature are recorded through a General Purpose Interface Bus (GPIB) connection to a computer as alluded to and described above with reference to FIG. 1. The capacitance versus temperature measurement was repeated for 5 separate devices, and the results are shown in FIG. 17. FIG. 17 is a graph of capacitance measurements of the MEMS sensor measured in pF vs. temperature for various samples in comparison to the analytical model. The error is within 5% over the entire operating range. Discrepancies are a result of package parasitics and can be reduced with automated fabrication and packaging. The maximum temperature error for all samples at all temperatures compared to the analytical model is under 4° C. The mean error is about 2° C., with a standard deviation of about 1° C. A gap of 4 μm was considered based on typical undercut from the $XeF_2$ release. Typical residual stress values of −270 MPa and −50 MPa were considered for the thermal $SiO_2$ and sputtered gold, respectively. Measurements were also conducted up to 300° C., as shown in FIG. 18. This method may require a furnace, because most ovens' highest operating point is 200° C. The device must also be attached to the wires with a high-temperature thermally conductive paste because solder and epoxies cannot operate at this temperature. Note that capacitance parasitics are larger due to the furnace.

Figure 19:
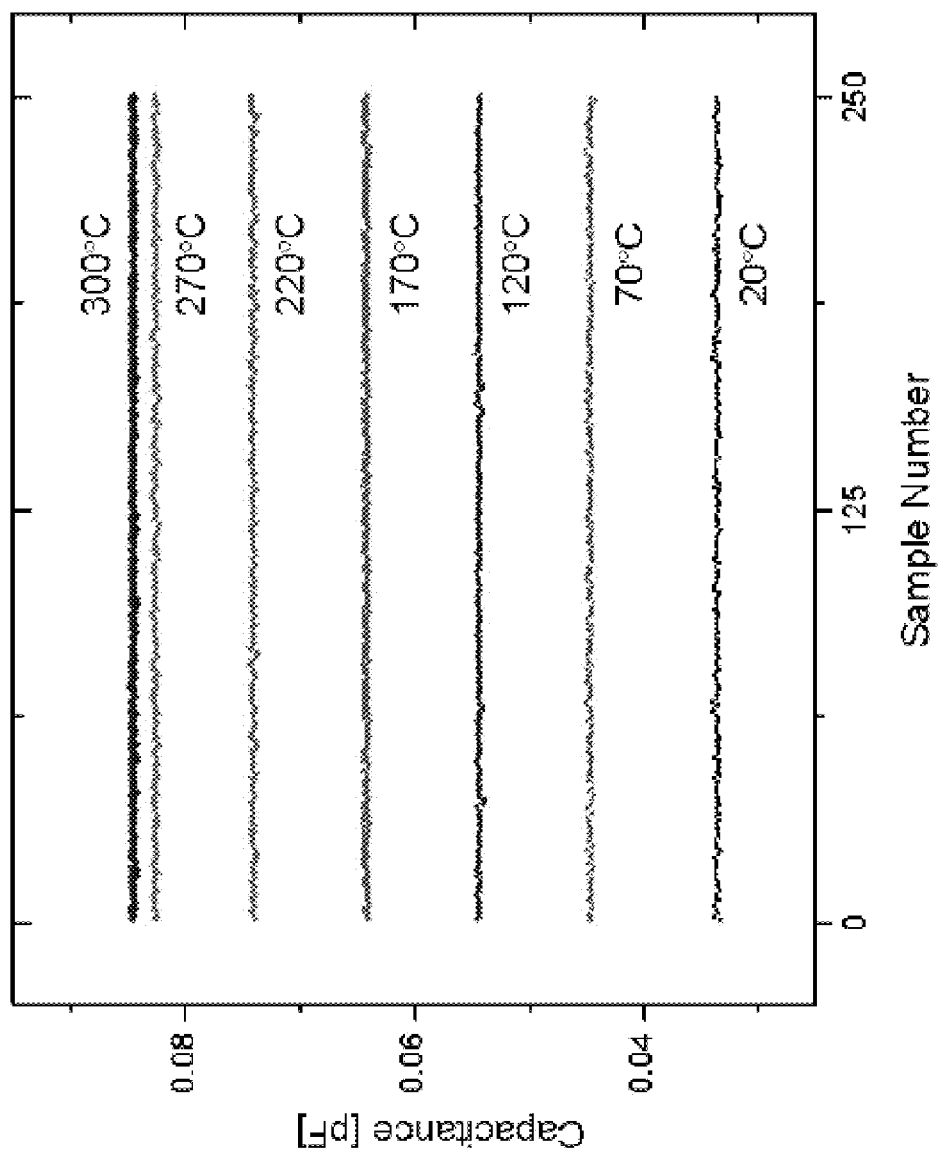
FIG. 19 is a graph of capacitance of the MEMS sensor for various samples across different temperature values, showing high degree of repeatability of the sensors.

To test for uncertainty in results, the fabricated bimorph beams were actuated electro-thermally using joule heating (see FIG. 27, discussed below) to assess the uncertainty without waiting for a hotplate to stabilize. This method also ensures no probing or measuring equipment is damaged by high temperatures. To measure the temperature uncertainty, a succession of capacitance values is measured at several different biases, as shown in FIG. 19. The capacitance is measured using an Analog Devices AD7746, which is among the most accurate commercially available capacitance measurement integrated circuits, with RMS noise of only 4.2 aF. A more realistic uncertainty of about 40 aF occurs with the evaluation board and capacitance probes. This uncertainty is increased to 120 aF when bias probes are applied as well. By noting the uncertainty of the capacitance over each set of samples, a value for the temperature uncertainty of the sensor can be extracted. In this actuation scheme, current localizes in the corners of the beam, and the anchor of the cantilever is connected to the substrate which acts as a heat-sink. As a result, there is a temperature gradient across the beam, and the profile is different from the purely-thermal curve, with slightly more deflection at the beam tip. The stated temperature values were obtained by matching the deflections at the beam midpoints with those of the purely-thermal curves.

Table II summarizes the measured sensor capacitance results. At high temperatures when the cantilevers are significantly deflected, the capacitance variation is consistent with the uncertainty at lower temperatures. This indicates that vibration is not a significant source of error. Indeed, even an applied acceleration of 100 g results in a maximum tip displacement of about 90 nm, which is under 0.1% of its range, and accounts for less than 80 aF of capacitance change per fully-deflected beam. As a result, the measured capacitance uncertainty is due largely to parasitics in the measurement setup. While capacitance measurements were conducted in a metallic enclosure, parasitics due to metallic cables and probes could not be completely avoided. Consequently, the uncertainty values stated in Table II are primarily limited by the measurement setup which can be improved based on commonly applied techniques known to a person having ordinary skill in the art.

TABLE II

SUMMARY OF UNCERTAINTY MEASUREMENT RESULTS

| Equivalent Temperature | Mean Capacitance | Standard Deviation | Extracted Temperature Uncertainty | Uncertainty |
|---|---|---|---|---|
| 20° C. | 33.62 fF | 0.13 fF | 0.64° C. | 3.21% |
| 70° C. | 44.74 fF | 0.13 fF | 0.61° C. | 0.87% |
| 120° C. | 54.50 fF | 0.13 fF | 0.60° C. | 0.50% |
| 170° C. | 64.34 fF | 0.11 fF | 0.53° C. | 0.31% |
| 220° C. | 74.12 fF | 0.12 fF | 0.59° C. | 0.27% |
| 270° C. | 82.66 fF | 0.13 fF | 0.60° C. | 0.22% |
| 300° C. | 84.55 fF | 0.12 fF | 0.57° C. | 0.19% |

Typical quality factors of commercial capacitors are around 1,000 at 1 MHz and room temperature. The simplest estimate for the capacitance quality factor (Q) for the present MEMS device can be obtained by considered that a) dielectric loss is negligible at these frequencies, b) the MEMS chip is in substantially perfect contact with the package, and c) the package and measurement setup do not limit Q. In the case of present disclosure, a simple analytical expression can be written as $$Q = \frac{1}{2\pi fRC}$$

Referring back to the layout shown in FIG. 8(a), there is an electric field between the metal layer and substrate. For a given frequency and capacitance, Q is directly proportional to 1/R. The resistance expected from the low resistivity substrate can be approximated as $$R = \frac{\rho l}{A}$$

where $\rho$ is the substrate resistivity, and A is the surface area (beneath the metal pad). The calculated quality factor with a $\rho$=0.01 ohm-cm is about 50,000 at 1 MHz. A variety of devices (25 total) have been measured by an LCR meter and the maximum value at room temperature is approximately 5,000 (Table III). Consequently, Q is limited experimentally by one of the following: the connection from the chip to the package, the bimorph structures, the package itself, or the measurement setup. In order to simultaneously check all possibilities, all combinations of the following approaches are measured using the same dimensions for the chips and pads: 1) A typical device, with standard dimensions as seen in FIG. 4. 2) The same layout and pad, but with no bimorph structures. 3) Epoxy mounting of the samples to the header. 4) Gold-gold bonding of the samples to the header. In addition, the following are used to evaluate the Q of the package and measurement setup: 1) Mounting a commercial capacitor with a known Q value in a header. 2) Attaching leads and measuring a commercial capacitor with a high Q.

TABLE III

MEASURED QUALITY FACTORS FOR VARIATIONS OF SENSORS.

| Fabrication Variation (5 samples each) | Mean Q | Standard Dev. (%) | Max Q | Min Q |
|---|---|---|---|---|
| No Bimorphs Epoxy Mounting | 685 | 54.30% | 1103 | 305 |
| Bimorphs Epoxy Mounting | 710 | 90.12% | 1560 | 159 |
| No Bimorphs Au—Au Bond Mounting | 4456 | 6.69% | 4878 | 4237 |
| Bimorphs Au—Au Bond Mounting | 4915 | 10.84% | 5568 | 4395 |

All measurements have been conducted at 1 MHz at room temperature. Additionally, the same layout used for all variations is identical to the sensor shown in 4.

As seen from Table III, the quality factor is much higher, and much more consistent for the versions with Au—Au bonding than with epoxy mounting. Although the epoxy is conductive, the ohmic connection to the silicon is poor, as well as inconsistent. Therefore, for any application requiring a high quality factor and high-temperature operation an Au—Au bond is necessary. Similarly, the edge-effects of the bimorph beams should be note. These edges have a negligible impact on Q, at least at room temperature. To determine the effect of the bimorph structures on the quality factor, we can increase the temperature to the point where the fields from the bimorph structures are stronger.

Figure 20:
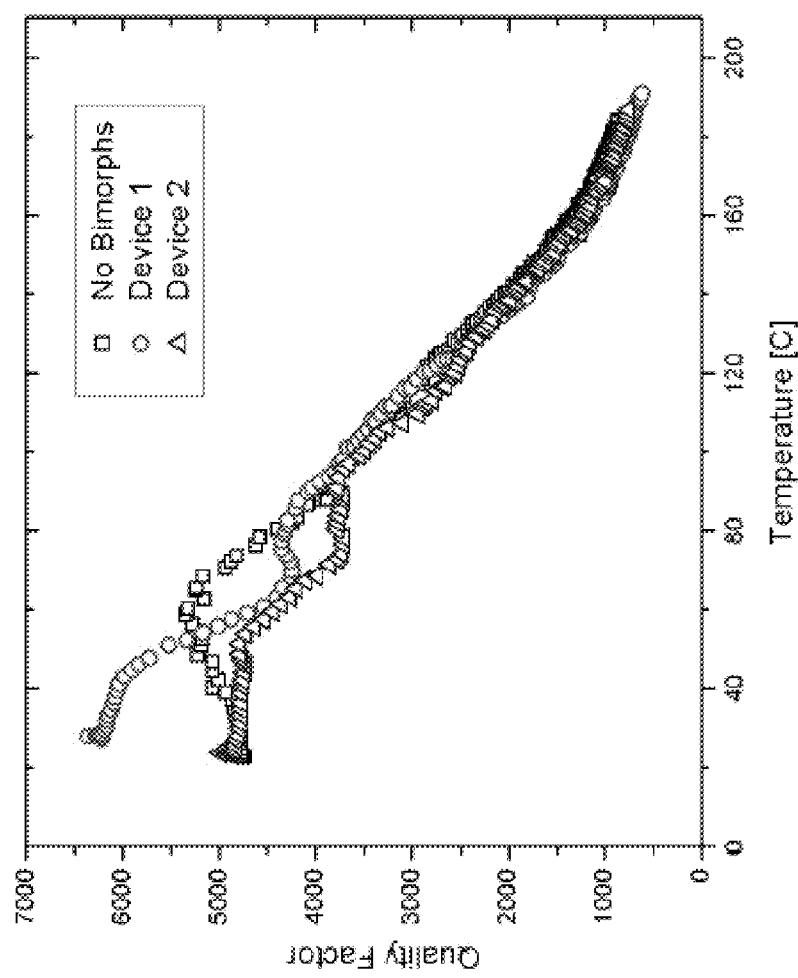
FIG. 20 is a graph of quality factor vs. maximum operating temperature of the MEMS sensor measured in °C. comparing the MEMS sensor arrangement of the present disclosure to various other arrangements found in the prior art.

FIG. 20 is a graph of quality factor vs. maximum operating temperature of the MEMS sensor measured in ° C. comparing the MEMS sensor arrangement of the present disclosure to various other arrangements found in the prior art. It can be observed that the bimorph structures do not limit the quality factor. Instead the package itself is limiting the quality factor, both at room temperature and as temperature is increased. As shown in FIG. 20, two identical devices with bimorph structures are measured versus temperature. In addition a sample without bimorph structures but otherwise identical to the previous two is also measured. The quality factor results are essentially the same for all three samples.

Figure 21:
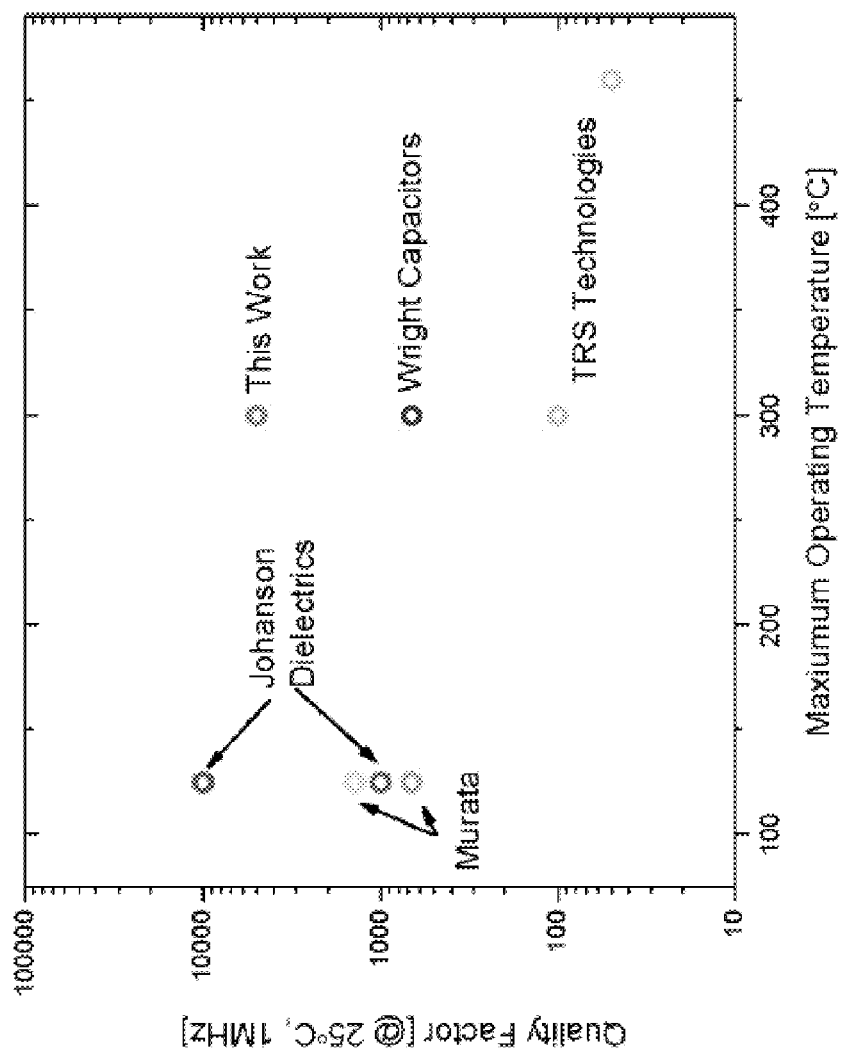
FIG. 21 is a graph of quality factor vs. maximum operating temperature measured in °C. showing various commercially-available capacitors suitable for similar classes of applications and their reported room-temperature quality factor at 1 MHz, along with the stated maximum operating temperature.

As far as the package effect is concerned, it can be observed that a commercial ceramic capacitor with leads attached has a Q in the setup according to the present disclosure of about 12,000, as expected. However, when placed inside of one of the TO headers, its Q drops to around 2,000. Also, an empty package containing no device has a similar reduction in Q with temperature to that observed in FIG. 20. Therefore, the primary limitation of the Q is caused by the package itself. However, even in the commercial package used, the room temperature quality factor presented here, combined with the maximum operating temperature of the device, yields a significant improvement above any existing capacitor suitable for this application, as shown in FIG. 21. FIG. 21 is a graph showing various commercially-available capacitors suitable for a similar application, and their reported room-temperature quality factor at 1 MHz, along with the stated maximum operating temperature. Some of these commercial capacitors are not guaranteed to be monotonic in the entire range. This graph shows that our sensor has achieved a robust balance of high-temperature operation and high quality factor, something not previously available.

To determine the sensor response speed the cantilevers are electro-thermally heated. It is found experimentally that the cantilevers are fully-deflected at 50 mA of current. The employed bias signal therefore is a sharp step from 0 mA-50 mA followed by another sharp step from 50 mA-0 mA. The source used was a Keithley 6221 Precision Current Supply, which has a stated settling time of 3 μs (to within 1% of the 50 mA applied). Once the sample was on the stage and bias lines connected, a microscope was placed at an angle to the substrate to accurately determine when the beams are fully deflected. Next, a high-speed camera (NAC Image Technology—Hot Shot SC) was attached to the microscope. The highs-peed camera was used to capture a sequence of images at 5,000 Hz while the bimorph structures were thermally cycled. By determining the number of frames it takes to completely move from fully relaxed to fully-deflected, we obtained the expected heating time from room temperature to about 300° C. and vice versa. From the obtained images it is shown that the time is less than 600 μs for both heating and cooling of the beams. Because this sensor has a necessary response time of seconds, and not microseconds, obtaining this data is useful when reviewing reliability, in which cycling of the sensors is performed. If millions or billions of cycles are desired, it is very useful to know at what frequency the sensors can be actuated, so that measurements can be done rapidly. Note that when packaged, the heat flow through the package will need to be taken into account as well. However, if the sensor is properly attached, this time should be minimal.

Figure 22:
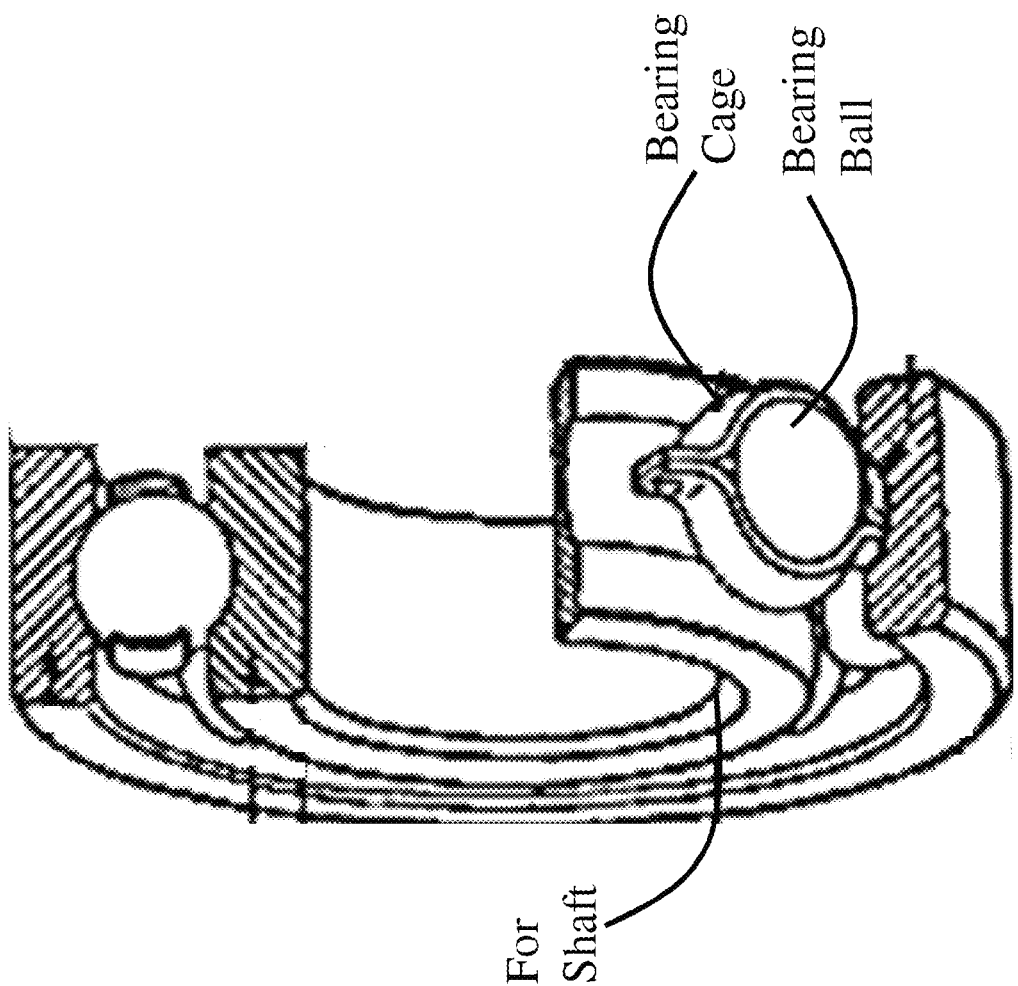
FIG. 22 is an exemplary schematic of a bearing depicting a ribbon-type bearing cage.

FIG. 22 is an exemplary schematic of a bearing depicting a ribbon-type bearing cage.

Figure 23:
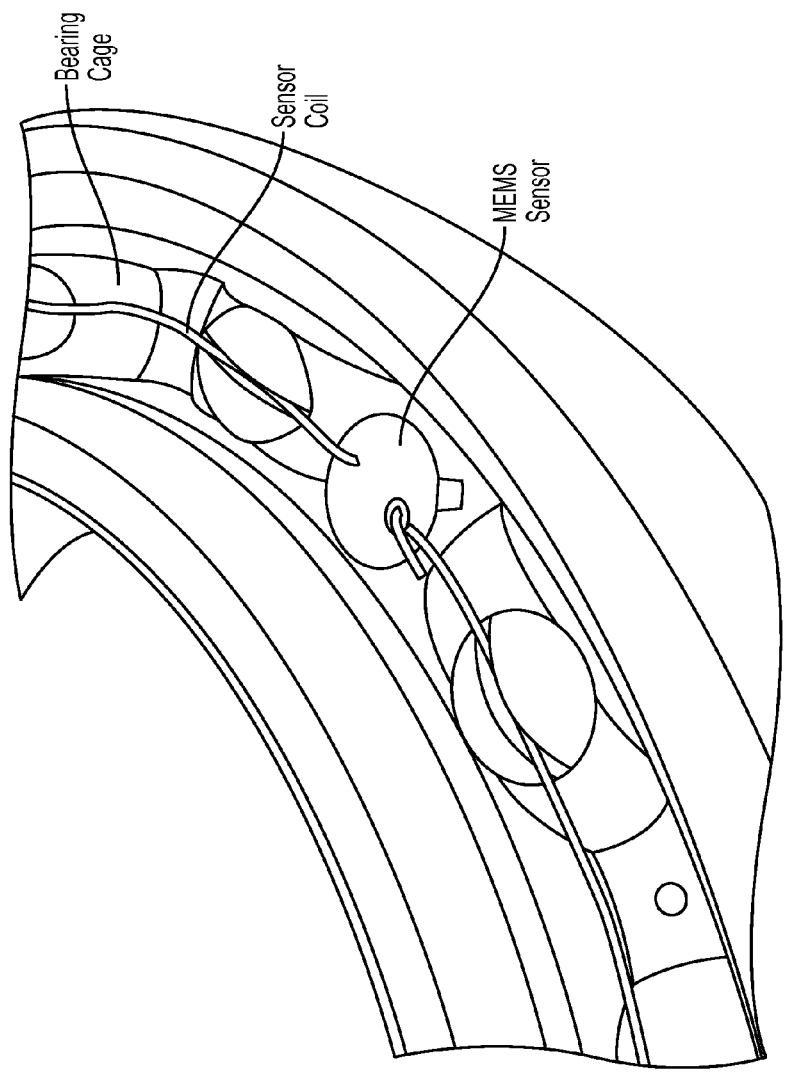
FIG. 23 is an exemplary implementation of the MEMS sensor and sensor coil in the bearing of FIG. 22, where the MEMS sensor is positioned between two crowns of the ribbon cage and the sensor coil is attached to the crowns expanding the circumference of the bearing.

FIG. 23 is an exemplary implementation of the MEMS sensor and sensor coil in the bearing of FIG. 22, where the MEMS sensor is positioned between two crowns of the ribbon gate and the sensor coil is attached to the crowns expanding the circumference of the bearing.

Figure 24:
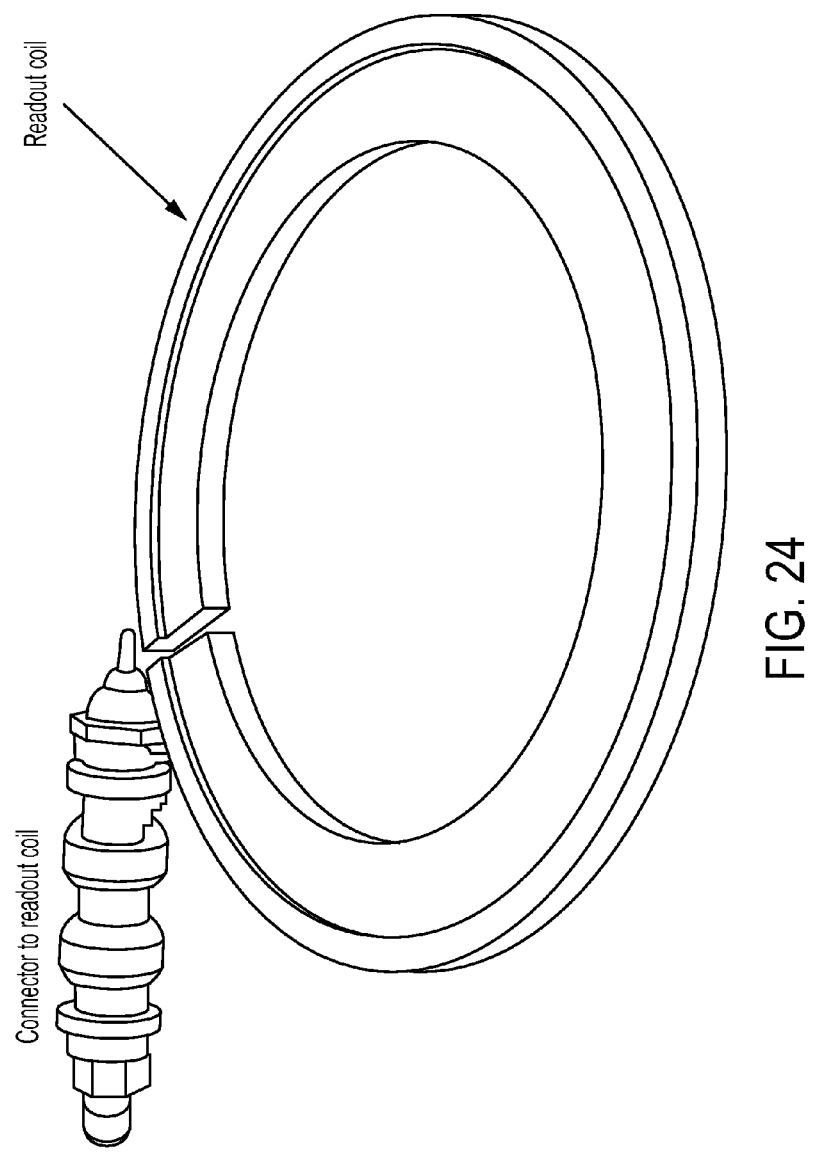
FIG. 24 is an exemplary implementation of a readout coil and the readout coil terminals.

FIG. 24 is an exemplary implementation of a readout coil and the readout coil terminals.

Figure 25:
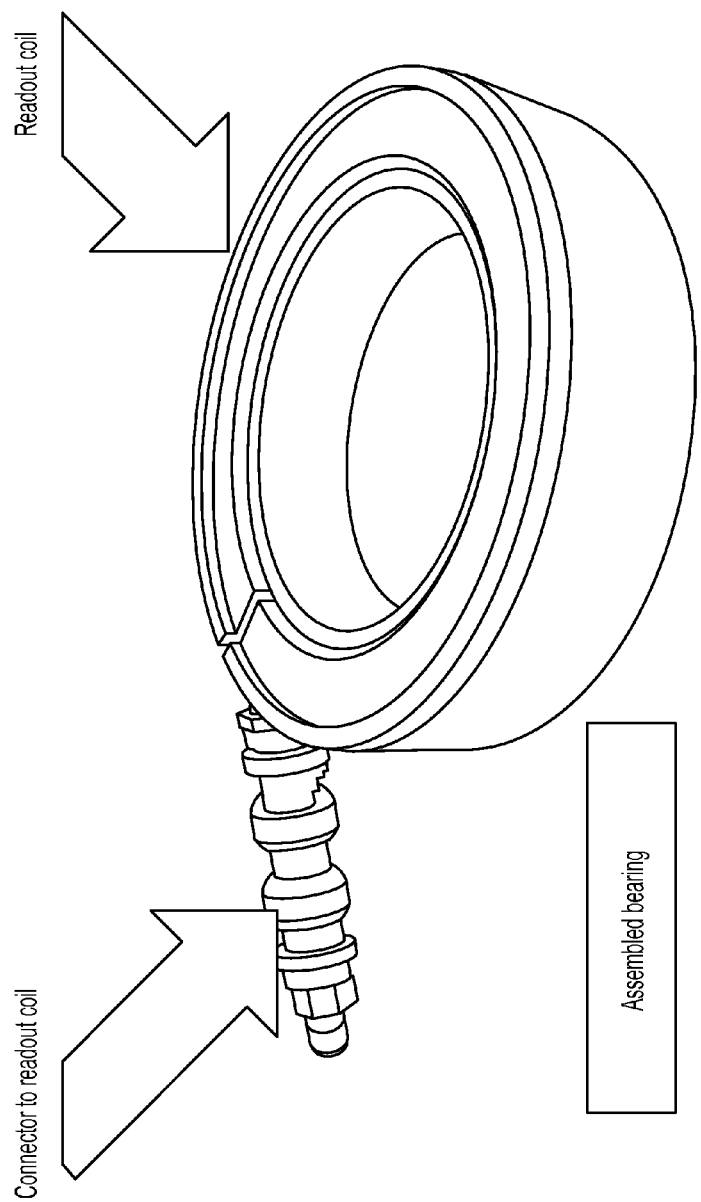
FIG. 25 is an exemplary implementation of an assembled bearing with the MEMS sensor arrangement assembled into a bearing assembly.

FIG. 25 is an exemplary implementation of an assembled bearing with the MEMS sensor arrangement assembled into a bearing assembly.

FIGS. 26($a$)-26($c$) are schematic views of one embodiment of manufacturing and assembly of the MEMS sensor, according to the present disclosure. In FIG. 26($a$) a wet oxide is thermally-grown on a low resistivity silicon wafer (i.e., electrically conductive substrate 152, see FIG. 3). In FIG. 26($b$) oxide (i.e., electrically insulating layer 154) is then patterned and etched with a wet etching process. In FIG. 26($c$) electrically conducting layer (e.g., Ti/Au) is then deposited and patterned with a wet-etch. Ti/Au is deposited on the back of the wafers for mounting, and the samples are diced (not shown). Alternative methods are described in FIG. 26($d$), below.

FIG. 26($d$) is a block diagram that provides on exemplary embodiment for fabrication, packaging and post processing steps. The steps shown in FIG. 26($d$) are intended to be exemplary of one embodiment. Other substitutes are available. The fabrication process starts with a conducting substrate. The material can be silicon. In step 202, a layer of insulating material, e.g., silicon dioxide, is thermally grown on the conducting substrate. The growth process can be a wet oxidation. Next in step 204 the insulating layer is patterned and etched to generate the electrically insulating pad and a plurality of beams terminating and being anchored by the insulating pad. The etchant can be buffer oxide etchant, e.g., combination of $NH_4F$ and HF. Next in step 206, the conducting layer is deposited, e.g., by sputtering, patterned and etched to form a matching electrically insulating pad and a plurality of beams terminating and being anchored by the conducting pad. The metal can be gold, titanium, aluminum, copper, or other suitable material used in semiconductor technology. Alternatively, the deposition step can be based on a lift off process, known to a person having ordinary skill in the art, where a sacrificial layer is used. In accordance to another method, a self-aligning process, known to a person having ordinary skill in the art, can be used to pattern and etch both layers (conducting and insulating) for a high degree of alignment. It is possible to use one etchant to etch both layers. Alternatively, it may be needed to use two different etchants, one for the conducting layer and one for the insulating layer, while using the conducting layer as a mask to etch away the insulating layer. Next in step 208, a conducting layer is depicted on back of the substrate prior to mounting to a header, i.e., packaging starting at step 210. Once mounted, in step 212, a well area (see 158 in FIG. 3) under the combinations of conducting layer/insulating layer beams is removed by applying an etchant, e.g., $XeF_2$, as discussed above. The well area can be etched to have a depth of about 4 μm, however, a range of 3-5 μm may also be considered. It is possible to etch the well area prior to mounting, i.e., partially packaging. Once the etching process is complete, the remainder of packaging operation can be completed by placing a cap and sealing in the fabricated assembly, as provided in step 214. In step 216 the entire package can be placed in an oven, e.g., at about 200° C. for about 36 hours. Again the annealing can be performed prior to completing the package in step 214.

It is important to note various characteristics of the MEMS sensor are more critical than others. Amongst these characteristics are thickness of the beams, length of the beams, width of the beams, material of the insulating material, process of fabricating the insulating material, and the number of beams. In this sense, while other ranges may be suitable, some ranges are provided in particular. For example, for the thickness the range may vary from 0.25 μm to 1.25 μm, for length of the beams the range may vary from between 100 μm to 300 μm, for width the range may vary from 5 μm to 20 μm, for material the insulating material may include $SiO_2$, $Si_3N_4$, or other well-known silicon-based electrically insulating material, and the number of beams may vary from 5 to 500.

The two main sources of inconsistency in mechanical systems such as contact-free MEMS are fatigue and creep. Creep tends to cause change in stress in a device while held at a constant strain or vice-versa. Fatigue is caused from repeated changes in stress or strain and results in permanent plastic deformation in the material.

Since one application of the MEMS sensor according to the present disclosure is for The thermal condition monitoring of engine components, the MEMS sensor should remain consistent for the duration of the component's lifetime. Typical engine components have lifetimes in the thousands of hours, and may endure tens of thousands of thermal cycles. It is important for a designer to know material properties and film stresses and as a result the impact of hysteresis or creep.

Referring back to FIG. 26($c$), a thermal anneal process can be added as the last step of the fabrication process for the MEMS sensor. This annealing process is advantageous to achieve consistent beam displacement during sustained high temperatures. This consistent displacement corresponds to a consistent capacitance and thus temperature reading while the sensor is interrogated over a period of time. Anneal and short-term creep testing are demonstrated for over 100 hours at both 200° C. and 275° C. In addition, the sensors were tested for creep for a period of 3 months at 200° C. Preliminary results of accelerated thermal cycling provide to demonstrate the reliability of the device to over 109 actuation cycles from room temperature to 300° C. and back.

Thermal annealing significantly decreases hysteresis. For example, the first thermal cycle of an oxide thin film can demonstrate significantly greater hysteresis than the second or any ensuing cycles. For Al—$SiO_2$ bimorph structures, this "break-in" period has been shown to allow the MEMS sensor to operate at stresses up to the break-in stress without further hysteresis. Since it is important for the sensor's reading to stay constant during use at a constant temperature, a break-in thermal anneal process was carried out.

As the thermal annealing process occurs, the residual stresses of the beams change over time. Thus, the initial displacement and displacement of the bimorph structures with temperature is subject to change. Since the beams will take on different radii of curvature for a given temperature, it is desirable to know these new deflections for two reasons; 1) the new deflection profiles will change the capacitance of the beam, and this information is needed to design a sensor with a specific capacitance-temperature profile, and 2) it is desirable to know how these profiles change over time, and knowledge of stress relaxation provides a useful tool for designers trying to generate robust devices.

In order to measure the beam profiles, an Olympus LEXT laser confocal microscope was used. This tool allows extraction of full profiles of the beams, which provide much more information than just tip heights, and do this more accurately (measured uncertainties are discussed later) and rapidly than measuring manually using focus on an optical microscope. It is desirable to measure the beams at room temperature, as well as at an elevated temperature, but hot plates, ovens, and other temperature control mechanisms provide heat to a relatively large area. In order to avoid damaging optical measurement equipment, a meandering bimorph structure, shown in FIG. 27, was designed and fabricated to allow local temperature control of the beams through the use of Joule heating. The meandering structure was biased with a precision current supply and the power dissipation from the resistance of the thin gold film heated the bimorph structures. The midpoint height from electrothermal heating was compared with that of the purely-thermal curve. A 50 mA bias results in a beam tip inplane with the substrate, consistent with 300° C. for the beam geometry used. Large arrays of these structures can be fabricated for testing, as shown in FIG. 28.

Figure 29:
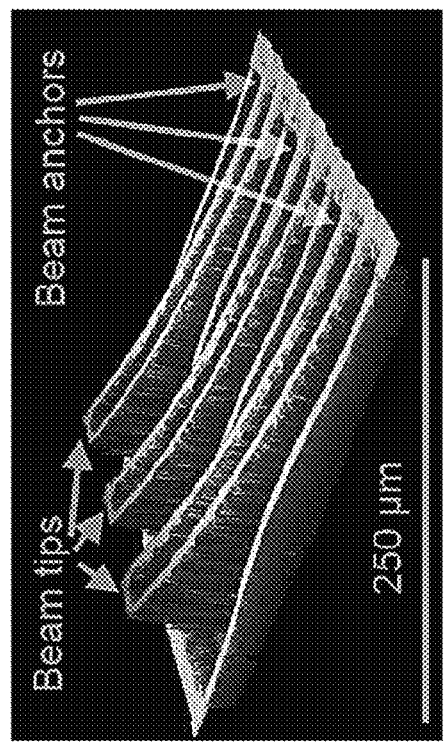
FIGS. 29(a) and 29(b) are confocal microscope images for (a) up state, and (b) down state which occurs with a 50 mA bias applied to the bimorph structure.
Figure 29:
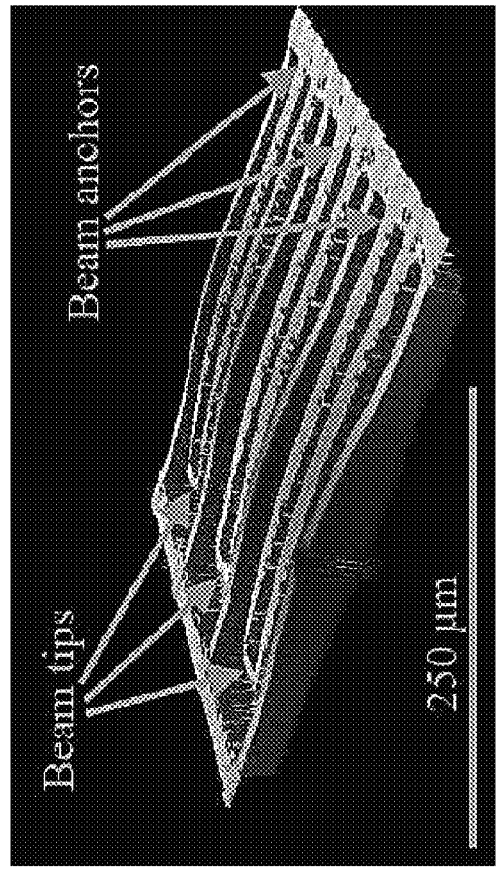

The mechanical displacements of thirty beams, from six samples, were initially measured in both an unbiased, room temperature state and a biased, high temperature state. FIG. 29 shows scans of an unbiased sample, FIG. 29(a), and a sample biased with 50 mA (at 3 Volts), FIG. 29(b), are provided. The 50 mA bias is considered to be the down state of the thirty beams throughout all scans. Each down-state scan required approximately ten minutes of DC bias. In the down-state, the beam tips curl down slightly farther than in normal thermal-loading. This is because there is current-crowding at the corners of the beams, which causes increased localized-heating.

Figure 30:
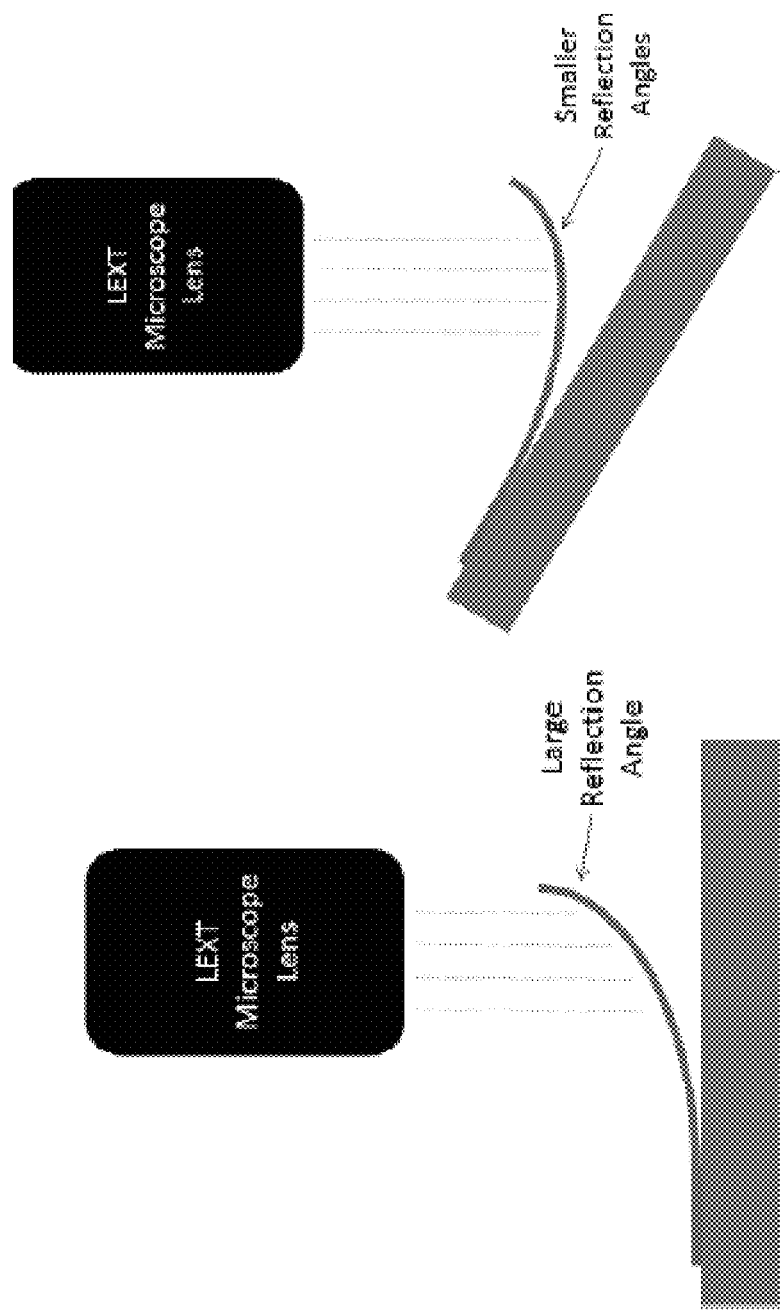
FIG. 30 provides schematic images of methods used to allow the microscope to scan by tilting the substrate, allowing the microscope to scan with a smaller reflection angle.

Proper profiles are difficult to obtain in the unbiased, large deflection cases. This is because the confocal microscope is reflection-based, and if the angle of incidence is large, the beam will reflect little signal to the objective. There were two major steps taken to obtain good profiles of these beams: 1) The samples are tilted with respect to the microscope stage, so that the greatest angle the beams form with the microscope is smaller (as seen in FIG. 30); and 2) A 5-stage gain was employed, where the gain of the microscope changes with height. This allows more signal to be received at areas where there is a smaller reflection angle, and less signal when it is close to flat, and it might be over-saturated.

To account for rotation discrepancy in all profile measurements, a MATLAB script was written to automatically shift the beam profiles and align them based on the anchor, cavity, and an alignment point after the edge of the beam. Note that although every effort is made to obtain accurate profiles in both states, the down-state is still more consistent due to the small reflection angles. Specifically, the estimated measurement uncertainty is 3 µm in the up state, and 0.1 µm in the down state. These uncertainties correspond to about 5° C. and 0.2° C., respectively.

Figure 27:
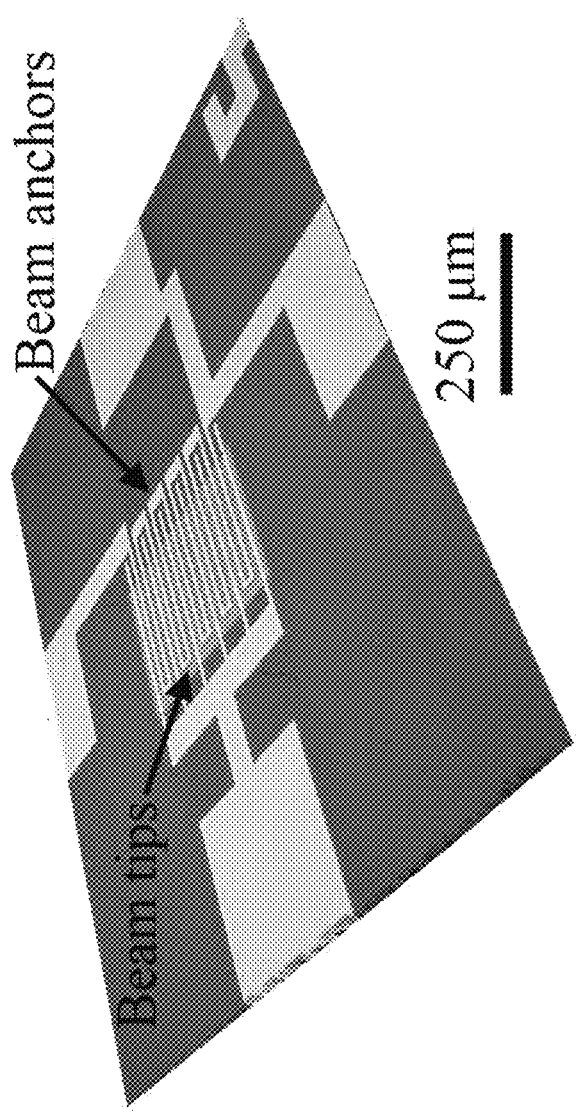
FIG. 27 is a schematic of a structure developed for joule heating which is used to thermally-heat the bimorph structures by allowing current to pass through the meandered bimorph structure to heat the beams.
Figure 28:
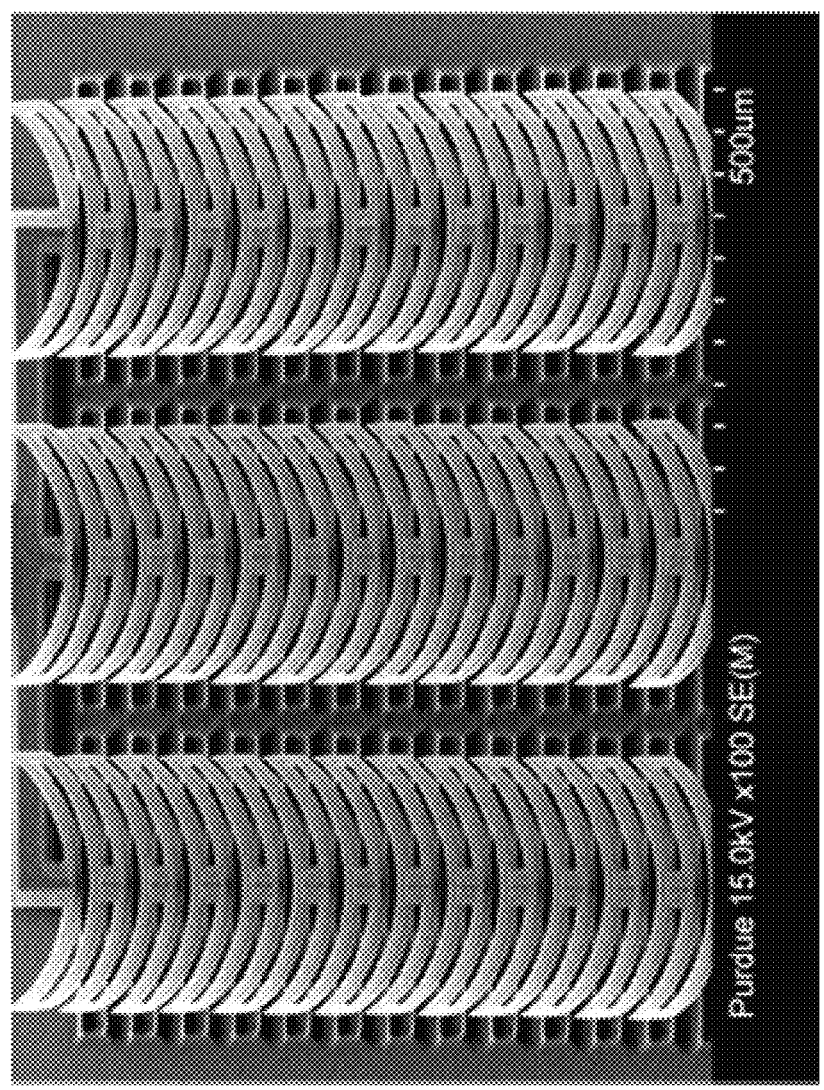
FIG. 28 is a scanning electron microscope image that shows Large arrays of these structures are fabricated for testing.
Figure 31:
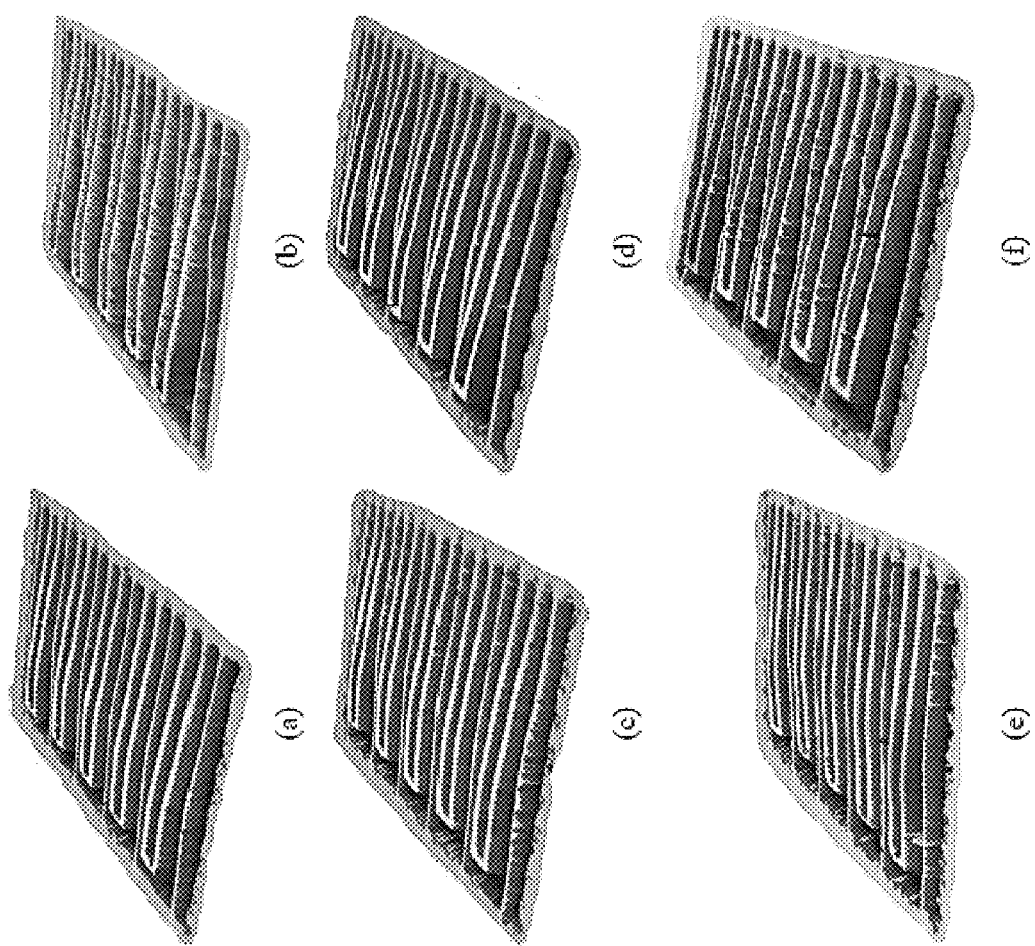
FIG. 31 (a)-(f) are 3D LEXT confocal microscope images of devices measured in down state (50 mA or 300° C.) before (a)-(b) first thermal cycle, (c)-(d) ten-millionth thermal cycle, and (e)-(f) hundred-millionth thermal cycle.

The meandering structure discussed with regards to FIG. 27 allowed actuation of the beams using Joule heating from a 500 Hz square wave with a 50% duty cycle. The automated program actuating the beams was set to automatically change polarity after every 10,000 cycles, because early samples were found to fail after several million cycles due to electromigration. As in anneal measurements, beams were scanned using the Olympus LEXT confocal microscope, which required that the beams have a DC bias for approximately 10 minutes for the down state scans. Twenty beams from four annealed samples were scanned periodically up to 108 cycles to measure displacement both at room temperature and in a deflected state, see FIG. 31. In addition, a separate sample was successfully actuated over 1.2 billion cycles, taking approximately five weeks at 500 Hz. In particular, FIG. 31 shows 3D LEXT confocal microscope images of devices measured in downstate (50 mA or 300° C.) before a-b) first thermal cycle, c-d) ten-millionth thermal cycle, and e-f) hundred-millionth thermal cycle. In all plots, the beam lengths are 250 µm, and the widths are 10 µm.

Figure 32:
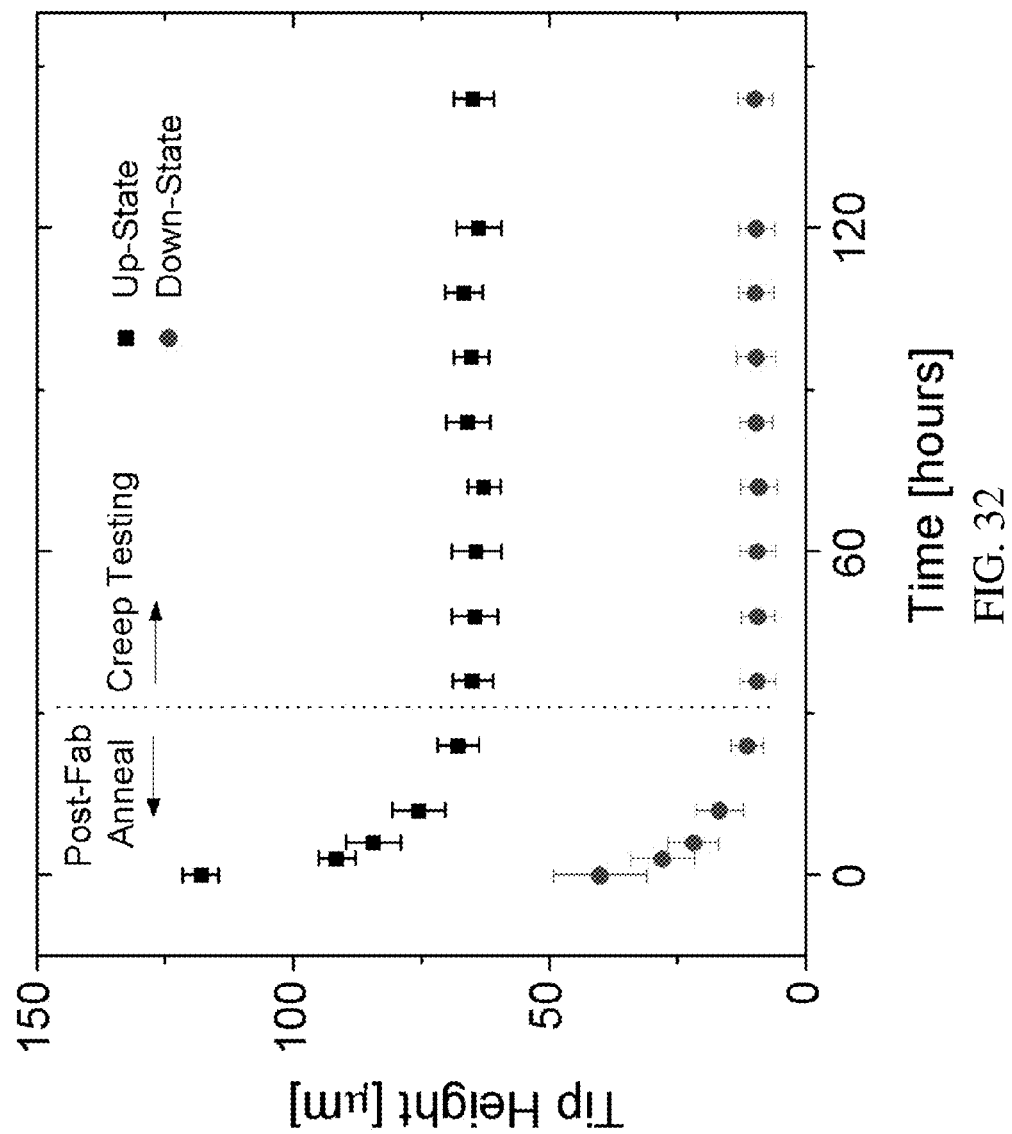
FIG. 32 is a graph of tip height measured in μm vs. time measured in hours.
Figure 33:
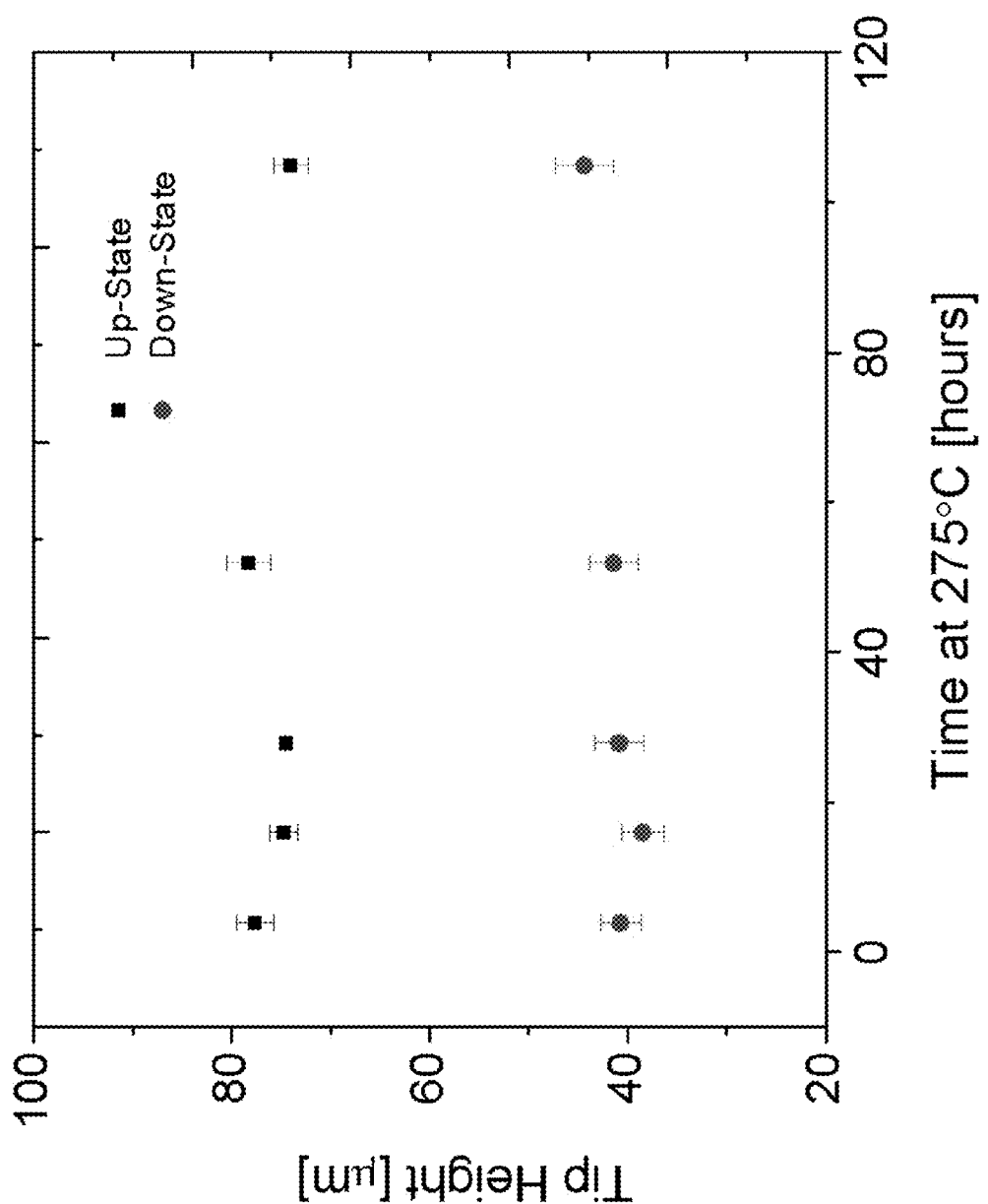
FIG. 33 is a graph of tip height measured in μm vs. time at 275° C. measured in hours.

FIG. 32 shows the measured height of the beam tips versus time for both the unbiased and biased cases for different amounts of time held at 200° C. It is clear that there is significant creep during the initial thirty-hours of anneal. During this "break-in" time the average tip displacement decreases from approximately 120 µm in the up state and 40 µm in the down state to approximately 70 µm in the up state and 10 µm in the down state. These and all error bars in this work show one standard deviation. After the anneal is finished, the process is continued to test for further creep in the beams. Additional samples from another lot were measured at an elevated temperature of 275° C. As can be seen from FIG. 33, the beam profiles reach an annealed state much more rapidly, yet still do not show signs of creep after over 120 hours. It should be noted that the error bars account for all of the measured beam data. The range of heights for a specific beam over time is actually much more consistent. For example, if a beam is initially at a certain height after anneal, it will consistently be at that position throughout the creep test.

Figure 34:
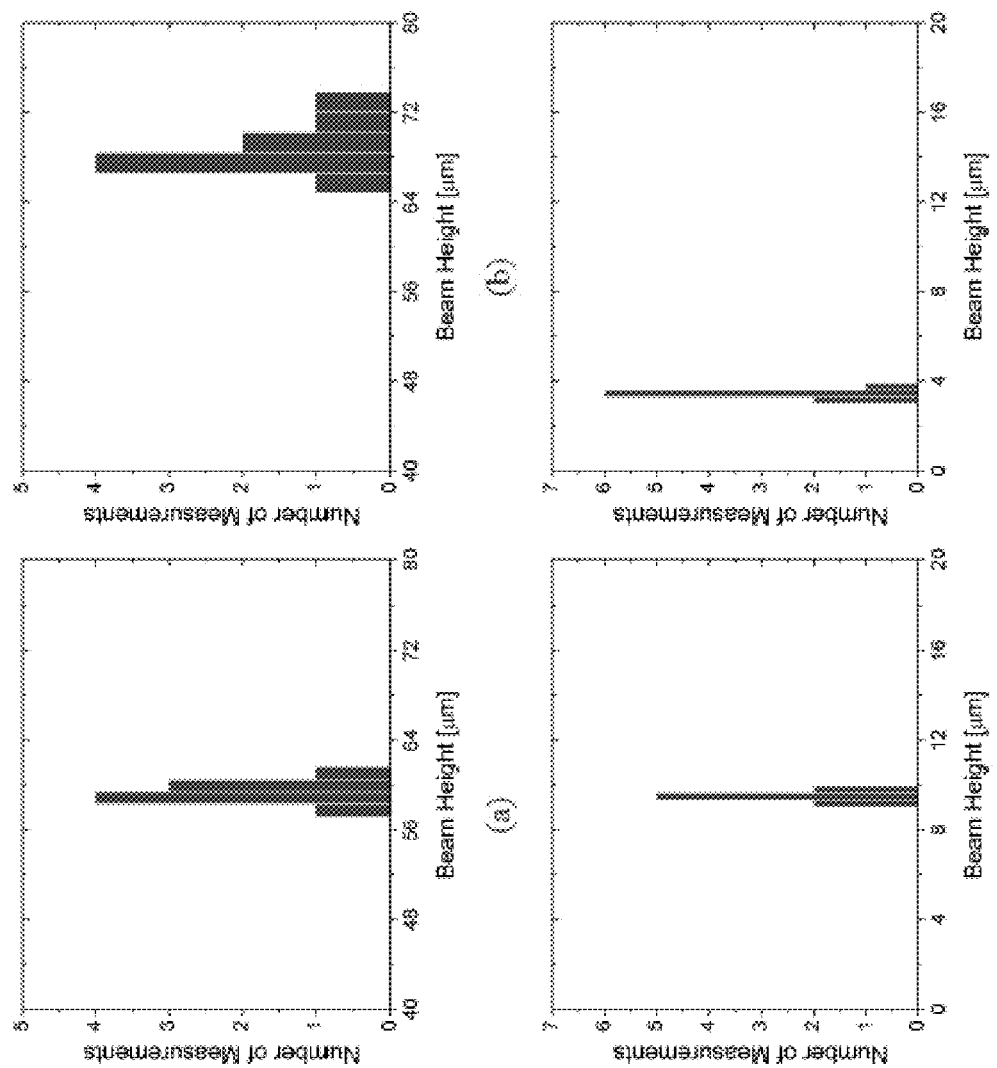
FIGS. 34 (a)-(d) are histograms for individual beams showing occurrences of different beam heights in (a)-(b) up state and (c)-(d) down state measured at each time point (starting at 36 hours) on FIG. 32.
Figure 35:
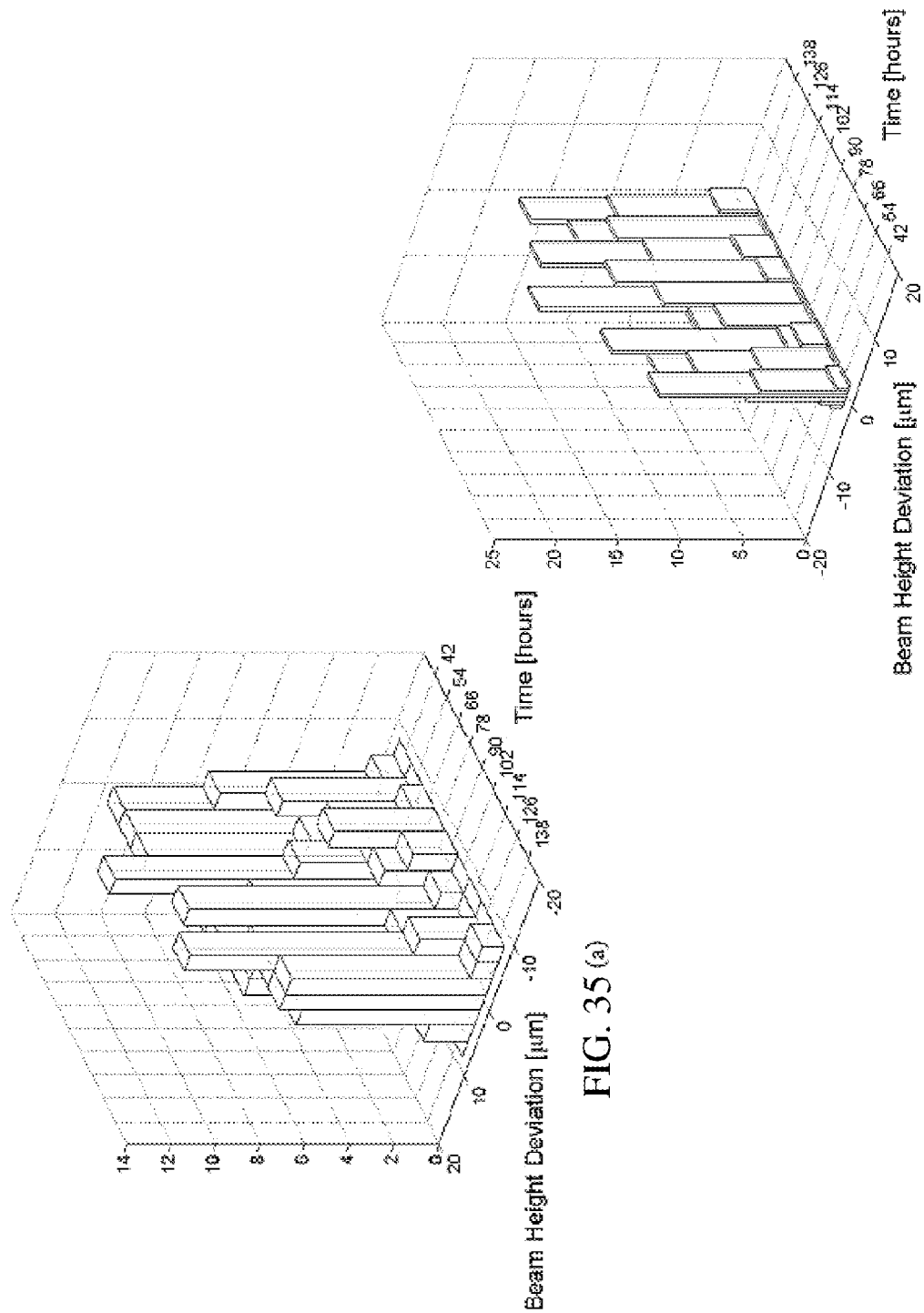
FIGS. 35 (a)-(b) are histograms detailing measurement occurrences of different beam heights in (a) up state and (b) down state.

FIG. 34 shows histograms for individual beams' positions throughout the creep test. As can be noted, each beam is consistent with itself, but may deviate in average height with other beams. The variance from beam-to-beam can be accounted for with process variation, which is not identical from sample-to-sample because of variation in the equipment. For one, the $XeF_2$ release is not perfectly uniform from sample to sample, causing some release uncertainty. The exact metal deposition thickness also may affect initial displacement due to a difference in residual stress, as well as biased displacement, due to different resistance, and thus, slightly different temperature for a given bias. It is important, then, to show the consistency one may achieve with a dedicated fabrication line. The histograms from FIG. 34 were repeated for each sample, as above, but the mean of each sample was de-embedded from the height to center all of the histograms over zero. They were then plotted together, separated by time in the creep test process. The resulting variation for both up state and down state cases are shown in FIG. 35.

Figure 36:
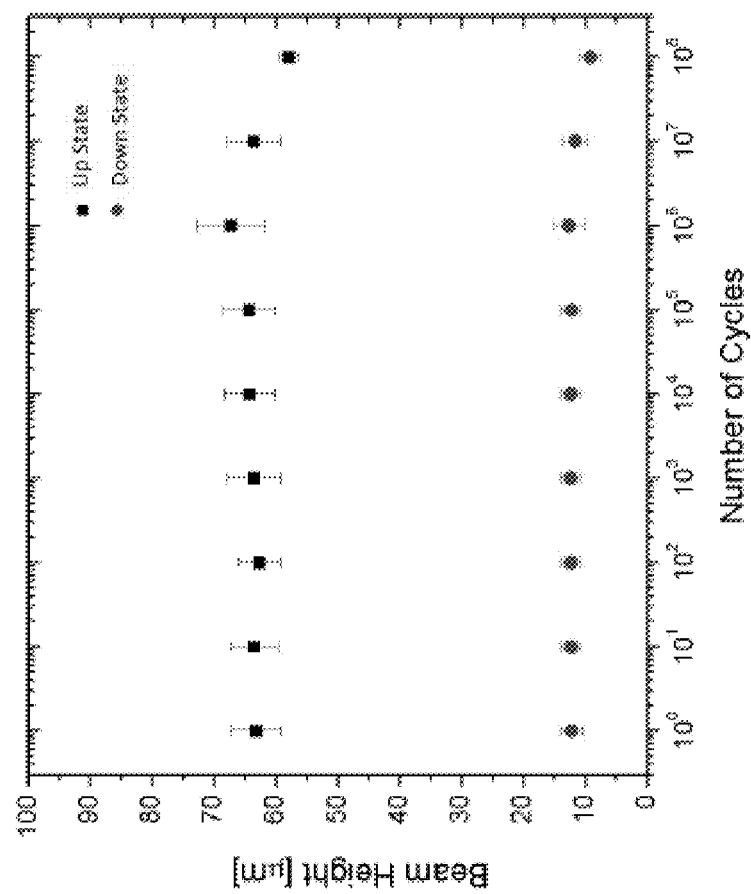
FIG. 36 is a graph of measured tip heights of over 20 beams versus number of cycles from room temperature to 300° C. and back.

One sample was left in the oven for over three months to further test the device for creep and material degradation. FIG. 36 shows beam profiles after an initial week in the oven and after three months at 200° C. in the up state (a) and down state (b). Note that the initial and final tip-heights of this sample are slightly different from FIG. 32, because it came from a different lot with slightly-different gold thicknesses. About 1 µm of deviation is observed so it is clear that the device is consistent. Furthermore, the need for optical measurements prohibited hermetic sealing, so a device hermetically-packaged would have significantly more protection from environmental contamination, and likely produce even more consistent profiles. To ensure all bimorph structures are past this break-in period and are fully-annealed, a 50 hour, 200° C. annealing process is standard on all devices which require further testing. While the 2,000 hours of operation may not be a long enough duration for some device applications, the lifetime of many engine bearings is in the 100-1,000 hours of use. In some applications, they are replaced after several hundred hours of use as preventative maintenance.

Figure 37:
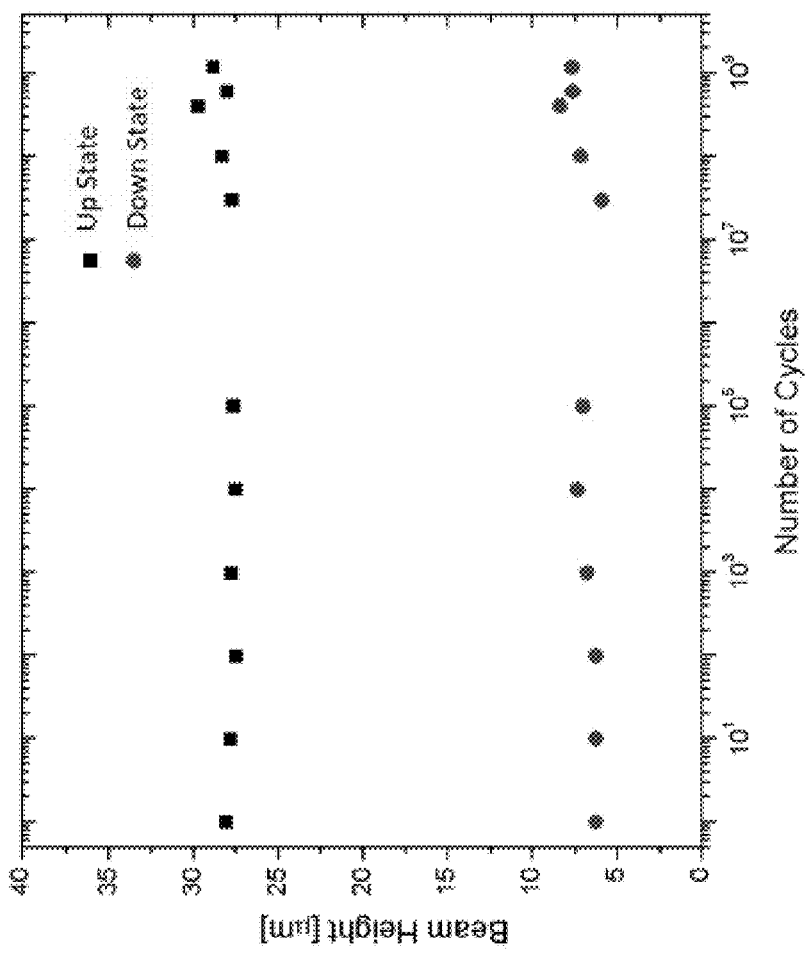
FIG. 37 is a graph of measured tip heights of additional sample measured up to 1.2 billion cycles from room temperature to 300° C. and back.

The bimorph structures used in the sensor are electrothermally actuated repeatedly from room temperature to 300° C. (as shown in FIG. 29(b)) and back and the profiles are measured. The tip displacement of over 20 beams throughout thermal cycling is presented in FIG. 36. These results indicate that after anneal, the device actuation is consistent, with less than 10 μm deviation in the up state averages and less than 3 μm deviation in the down state averages over 108 cycles. Error bars are shown signifying one standard deviation above and below the mean. Once again, the estimated measurement uncertainty is 3 μm in the up state, and 0.1 μm in the down state. Individual results for many beams are shown in the appendix of this paper. Due to the time-consuming nature of these measurements, only one sample was measured to 109 cycles (FIG. 37). The sample has increased error at larger numbers of cycles because it needed to be removed from the microscope stage between measurements. This is because the time between measurements becomes several days to about 5 weeks at one billion cycles. All of the tests performed contained devices stored either in the open-air environment of the oven or cycling setup. Typically, the beams would be packaged hermetically, further increasing the robustness and consistency.

In some MEMS devices such as telecommunications switches or actuators a billion cycles may be insufficient to qualify as lifetime characterization. However, over the life of an engine component, even millions of cycles are unlikely. As a result, the measurements performed here far exceed the requirements of these components.

Figures 38A, 38B:
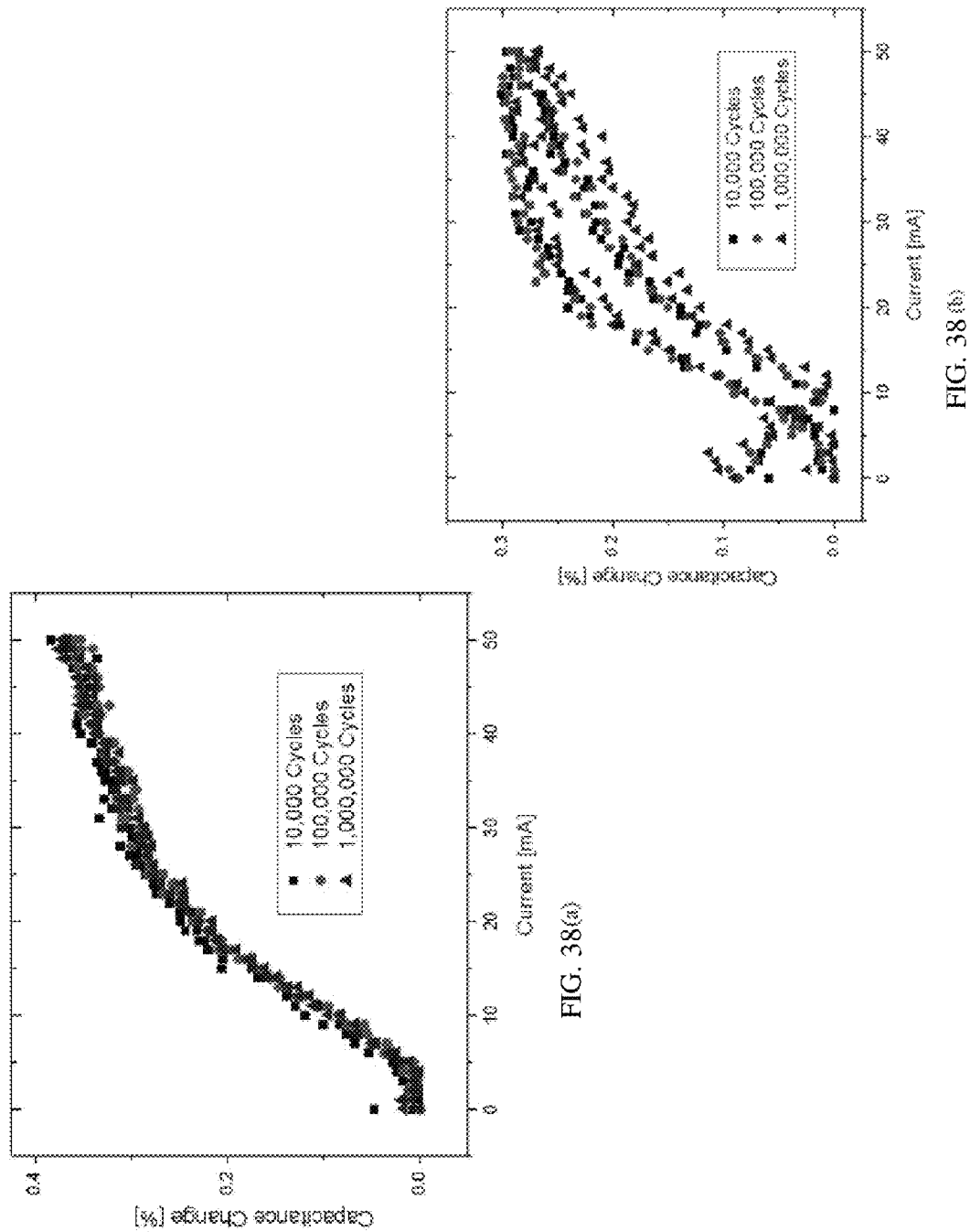
FIGS. 38(a) and 38(b) are graphs of capacitance change measured in % vs. current measured in mA showing hysteresis loops at high cycle numbers comparing devices with thermally-grown oxide and typical plasma enhanced chemical vapor deposition (PECVD)-based bimorph structures.

The mechanical-quality of the thermally-grown $SiO_2$ is one of the key elements that make the sensor reliable. One of the reasons for the increased mechanical quality is the temperature of growth/deposition. Thermal oxide is grown from a silicon wafer at 1,100° C., while commonly-used plasma enhanced chemical vapor deposition (PECVD) films are typically grown at 300° C. Many bimorph structures today use low-temperature silicon dioxide films (e.g., grown with PECVD processes). It is also known that these films contain many pinholes and have poor electrical and mechanical quality compared to high-temperature oxides (e.g. thermally-grown films). Poor mechanical quality is inferred from the inability of a material at a constant stress to repeatedly have the same strain, or vice-versa. This results in hysteresis loops, which are, in general, undesirable. A comparison of the two films is shown in FIGS. 38(a)-(b). As can be seen, the hysteresis is significantly reduced in the thermal oxide bimorph structures.

Those skilled in the art will recognize that numerous modifications can be made to the specific implementations described above. While the implementations have been illustrated and described in detail in the drawings and foregoing description, the same should be considered as illustrative and not restrictive in character. It is understood that all changes, modifications and further applications that come within the spirit of the disclosure are desired to be protected.

The invention claimed is:

1. A micro-electromechanical system-type (MEMS) wireless temperature measurement system, comprising:
 a MEMS sensor arrangement, including:
  a multimorph sensor,
  a sensor coil coupled to the multimorph sensor, and
   a readout coil configured to be magnetically coupled to the sensor coil to i) energize the sensor coil, and ii) provide a readout of a natural frequency of the multimorph sensor, the sensor coil and the readout coil;
 an energizing circuit configured to energize the readout coil; and
 a readout circuit configured to measure the natural frequency.

2. The MEMS wireless temperature measurement system of claim 1, wherein the multimorph sensor comprises:
 an electrically conducting substrate with a well area provided thereon;
 a plurality of electrically insulating beams disposed over the well area of the electrically conducting substrate and fixed to the electrically conducting substrate at a first end and moveable with respect to the well area of the electrically conducting substrate at a second and opposite end of each of the electrically insulating beams; and
 a plurality of electrically conducting beams, each electrically conducting beam attached to and positioned over a corresponding electrically insulating beam.

3. The MEMS wireless temperature measurement system of claim 2, wherein each of the plurality of electrically conducting beams having thermal expansion characteristics substantially different than each corresponding electrically insulating beam.

4. The MEMS wireless temperature measurement system of claim 3, wherein the second end of each combination of the electrically conducting beam and the corresponding electrically insulating beam is positioned at a first distance with respect to the electrically conducting substrate.

5. The MEMS wireless temperature measurement system of claim 4, wherein the multimorph sensor further comprises:
 an electrically insulating pad positioned over and fixed to the electrically conducting substrate, the electrically insulating beams terminate and are anchored at the electrically insulating pad; and
 an electrically conducting pad positioned over and fixed to the electrically insulating pad, the electrically conducting beams terminate and are anchored at the electrically conducting pad,
  wherein a combination of the electrically conducting pad, the electrically insulating pad, and the electrically conducting substrate result in a static capacitor, and a combination of the electrically conducting beams, the electrically insulating beams and the electrically conducting substrate result in a temperature-varying capacitor.

6. The MEMS wireless temperature measurement system of claim 5, wherein the first distance corresponds inversely to thermal energy applied to the multimorph sensor.

7. The MEMS wireless temperature measurement system of claim 6, wherein the first distance corresponds inversely to a temperature-varying capacitance of the multimorph sensor.

8. The MEMS wireless temperature measurement system of claim 5, wherein a temperature-varying capacitance of the multimorph sensor corresponds to thermal energy applied to the multimorph sensor.

9. The MEMS wireless temperature measurement system of claim 8, wherein a the relationship between the thermal energy applied to the multimorph sensor and the temperature-varying capacitance of the multimorph sensor is nonlinear.

10. The MEMS wireless temperature measurement system of claim 1, wherein the multimorph sensor and the sensor coil are affixed to a cage of a bearing assembly and the readout coil is affixed to a housing of the bearing assembly.

11. A micro-electromechanical system-type (MEMS) sensor arrangement for wirelessly measuring temperatures, comprising:
 a multimorph sensor;
 a sensor coil coupled to the multimorph sensor; and
 a readout coil configured to be magnetically coupled to the sensor coil to i) energize the sensor coil, and ii) provide a readout of a natural frequency of the multimorph sensor, the sensor coil and the readout coil.

12. The MEMS sensor arrangement of claim 11, wherein the multimorph sensor comprises:
- an electrically conducting substrate with a well area provided thereon;
- a plurality of electrically insulating beams disposed over the well area of the electrically conducting substrate and fixed to the electrically conducting substrate at a first end and moveable with respect to the well area of the electrically conducting substrate at a second and opposite end of each of the electrically insulating beams; and
- a plurality of electrically conducting beams, each electrically conducting beam attached to and positioned over a corresponding electrically insulating beam.

13. The MEMS sensor arrangement of claim 12, wherein each of the plurality of electrically conducting beams have thermal expansion characteristics substantially different than each corresponding electrically insulating beam.

14. The MEMS sensor arrangement of claim 13, wherein the second end of each combination of the electrically conducting beam and the corresponding electrically insulating beam is positioned at a first distance with respect to the electrically conducting substrate.

15. The MEMS sensor arrangement of claim 14, further comprising:
- an electrically insulating pad positioned over and fixed to the electrically conducting substrate, the electrically insulating beams terminate and are anchored at the electrically insulating pad; and
- an electrically conducting pad positioned over and fixed to the electrically insulating pad, the electrically conducting beams terminate and are anchored at the electrically conducting pad,
- wherein a combination of the electrically conducting pad, the electrically insulating pad, and the electrically conducting substrate result in a static capacitor, and a combination of the electrically conducting beams, the electrically insulating beams and the electrically conducting substrate result in a temperature-varying capacitor.

16. The MEMS sensor arrangement of claim 15, wherein the first distance corresponds inversely to thermal energy applied to the multimorph sensor.

17. The MEMS sensor arrangement of claim 16, wherein the first distance corresponds inversely to a temperature-varying capacitance of the multimorph sensor.

18. The MEMS sensor arrangement of claim 15, wherein a temperature-varying capacitance of the multimorph sensor corresponds to thermal energy applied to the multimorph sensor.

19. The MEMS sensor arrangement of claim 18, wherein a relationship between the thermal energy applied to the multimorph sensor and the temperature-varying capacitance of the multimorph sensor is nonlinear.

20. The MEMS sensor arrangement of claim 11, wherein the multimorph sensor and the sensor coil are affixed to a cage of a bearing assembly and the readout coil is affixed to a housing of the bearing assembly.

21. A method of making a micro-electromechanical system-type (MEMS) sensor arrangement for wirelessly measuring temperatures, comprising:
- thermally growing an electrically insulating layer over an electrically conducting substrate;
- depositing an electrically conducting layer over the electrically insulating layer;
- patterning and etching away to generate a combination of an electrically conducting pad, an electrically insulating pad, a plurality of electrically conducting beams and a plurality of electrically insulating beams, the plurality of the electrically conducting beams terminating and being anchored by the electrically conducting pad, and the plurality of the electrically insulating beams terminating and being anchored by the electrically insulating pad;
- and etching a well area under the electrically conducting beams and the electrically insulating beams.

22. The method of claim 21, wherein the patterning and etching away step is accomplished by a self-aligning process.

23. The method of claim 21, wherein the patterning and etching away step is accomplished by a lift off process using a sacrificial layer.

24. The method of claim 21, further comprising:
patterning and etching the electrically insulating layer; and
patterning and etching the electrically conducting layer.

25. The method of claim 21, further comprising:
- packaging the combination of the electrically conducting pad, the electrically insulating pad, the plurality of electrically insulating beams and the plurality of electrically conducting beams with the electrically conducting substrate to form a package; and
- annealing the package.

\* \* \* \* \*